United States Patent
Hwang et al.

(10) Patent No.: US 11,652,056 B2
(45) Date of Patent: May 16, 2023

(54) SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Ha-Min Hwang, Hwaseong-si (KR); Jong Soo Kim, Seoul (KR); Ju-Young Lim, Seoul (KR); Won Seok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 17/488,727

(22) Filed: Sep. 29, 2021

(65) Prior Publication Data
US 2022/0223525 A1    Jul. 14, 2022

(30) Foreign Application Priority Data

Jan. 13, 2021    (KR) .......................... 10-2021-0004321

(51) Int. Cl.
| | |
|---|---|
| *H01L 25/065* | (2006.01) |
| *H01L 23/535* | (2006.01) |
| *H01L 25/18* | (2023.01) |
| *H01L 23/00* | (2006.01) |
| *H01L 21/768* | (2006.01) |

(52) U.S. Cl.
CPC ...... *H01L 23/535* (2013.01); *H01L 21/76805* (2013.01); *H01L 21/76895* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ... H01L 23/535; H01L 24/08; H01L 25/0657; H01L 2224/08145; H01L 25/18; H01L 2924/1431; H01L 2924/14511
See application file for complete search history.

(56) References Cited

U.S. PATENT DOCUMENTS

| | | |
|---|---|---|
| 8,815,655 B2 | 8/2014 | Chen |
| 9,620,512 B1 | 4/2017 | Nishikawa et al. |
| 9,549,949 B2 | 5/2017 | Zhu et al. |

(Continued)

FOREIGN PATENT DOCUMENTS

KR    1995-0034527 A    12/1995

*Primary Examiner* — Thanh Y. Tran
(74) *Attorney, Agent, or Firm* — Lee IP Law, P.C.

(57) ABSTRACT

A semiconductor memory device includes a first substrate including a first region and a second region, a stacked structure only on the first region of the first substrate among the first region and the second region of the first substrate, the stacked structure including word lines, an interlayer insulating film covering the stacked structure, a dummy conductive structure inside the interlayer insulating film, the dummy conductive structure extending through the stacked structure to contact the first substrate, and a plate contact plug inside the interlayer insulating film, the plate contact plug being connected to the second region of the first substrate, and a height of an upper surface of the dummy conductive structure being greater than a height of an upper surface of the plate contact plug relative to an upper surface of the first substrate.

20 Claims, 19 Drawing Sheets

(56) References Cited

U.S. PATENT DOCUMENTS

| | | |
|---|---|---|
| 10,707,121 B2 | 7/2020 | Liu et al. |
| 2020/0161321 A1 | 5/2020 | Guo et al. |
| 2020/0251487 A1 | 8/2020 | Tang |
| 2020/0411542 A1* | 12/2020 | Yang ................. H01L 29/40114 |
| 2021/0005623 A1* | 1/2021 | Kim .................. H01L 27/11556 |

* cited by examiner

SEMICONDUCTOR MEMORY DEVICE AND ELECTRONIC SYSTEM INCLUDING THE SAME

CROSS-REFERENCE TO RELATED APPLICATION

Korean Patent Application No. 10-2021-0004321 filed on Jan. 13, 2021, in the Korean Intellectual Property Office, and entitled: "Semiconductor Memory Device and Electronic System Including the Same," is incorporated by reference herein in its entirety.

BACKGROUND

1. Field

The present disclosure relates to a semiconductor memory device and an electronic system including the same.

2. Description of the Related Art

As demand for light, thin, short, and small electronic products increases, there is an increasing demand for high integration of semiconductor devices. Since the size of components included in the semiconductor devices (e.g., transistors) also decreases with the increasingly high integration of the semiconductor devices, there is a problem of occurrence of leakage current. Therefore, it is necessary to control the leakage current of the semiconductor device to improve the performance and reliability of the semiconductor device.

On the other hand, there is a demand for a semiconductor device capable of storing high-capacity data in an electronic system that requires data storage. Accordingly, a way that may increase the data storage capacity of the semiconductor device is being researched. For example, as one of the methods for increasing the data storage capacity of the semiconductor device, a semiconductor device that includes three-dimensionally arranged memory cells instead of two-dimensionally arranged memory cells has been proposed.

SUMMARY

According to an aspect of the present disclosure, there is provided a semiconductor memory device including a first substrate including a first region and a second region, a stacked structure which is placed on the first region of the first substrate and includes a plurality of word lines, an interlayer insulating film which covers the stacked structure, a dummy conductive structure which is placed on the interlayer insulating film and the stacked structure and extends to the first substrate, and a plate contact plug which is placed inside the interlayer insulating film and connected to the second region of the first substrate, wherein the stacked structure is not placed on the second region of the first substrate, and a height of an upper surface of the dummy conductive structure is greater than a height of an upper surface of the plate contact plug, on the basis of an upper surface of the first substrate.

According to another aspect of the present disclosure, there is provided a semiconductor memory device including a first substrate including a first region and a second region, a stacked structure which is placed on the first region of the first substrate and includes a plurality of word lines, an interlayer insulating film which covers the stacked structure, a dummy conductive structure which is placed inside the interlayer insulating film and the stacked structure, and extends to the first substrate, and a plate contact plug which is placed inside the interlayer insulating film and connected to the second region of the first substrate, wherein the stacked structure is not placed on the second region of the first substrate, a height of an upper surface of the dummy conductive structure is different from a height of an upper surface of the plate contact plug, on the basis of an upper surface of the first substrate, and the plate contact plug includes a first conductive core pattern, and a first spacer extending along a side surface of the first conductive core pattern.

According to another aspect of the present disclosure, there is provided an electronic system including a main board, a semiconductor memory device placed on the main board, and a controller electrically connected to the semiconductor memory device, on the main board, wherein the semiconductor memory device includes a first substrate including a first region and a second region, a stacked structure which is placed on the first region of the first substrate and includes a plurality of word lines, an interlayer insulating film which covers the stacked structure, a dummy conductive structure which is placed inside the interlayer insulating film and the stacked structure, and extends to the first substrate, and a plate contact plug which is placed inside the interlayer insulating film and connected to the second region of the first substrate, the stacked structure is not placed on the second region of the first substrate, and a height of an upper surface of the dummy conductive structure is greater than a height of an upper surface of the plate contact plug, on the basis of an upper surface of the first substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
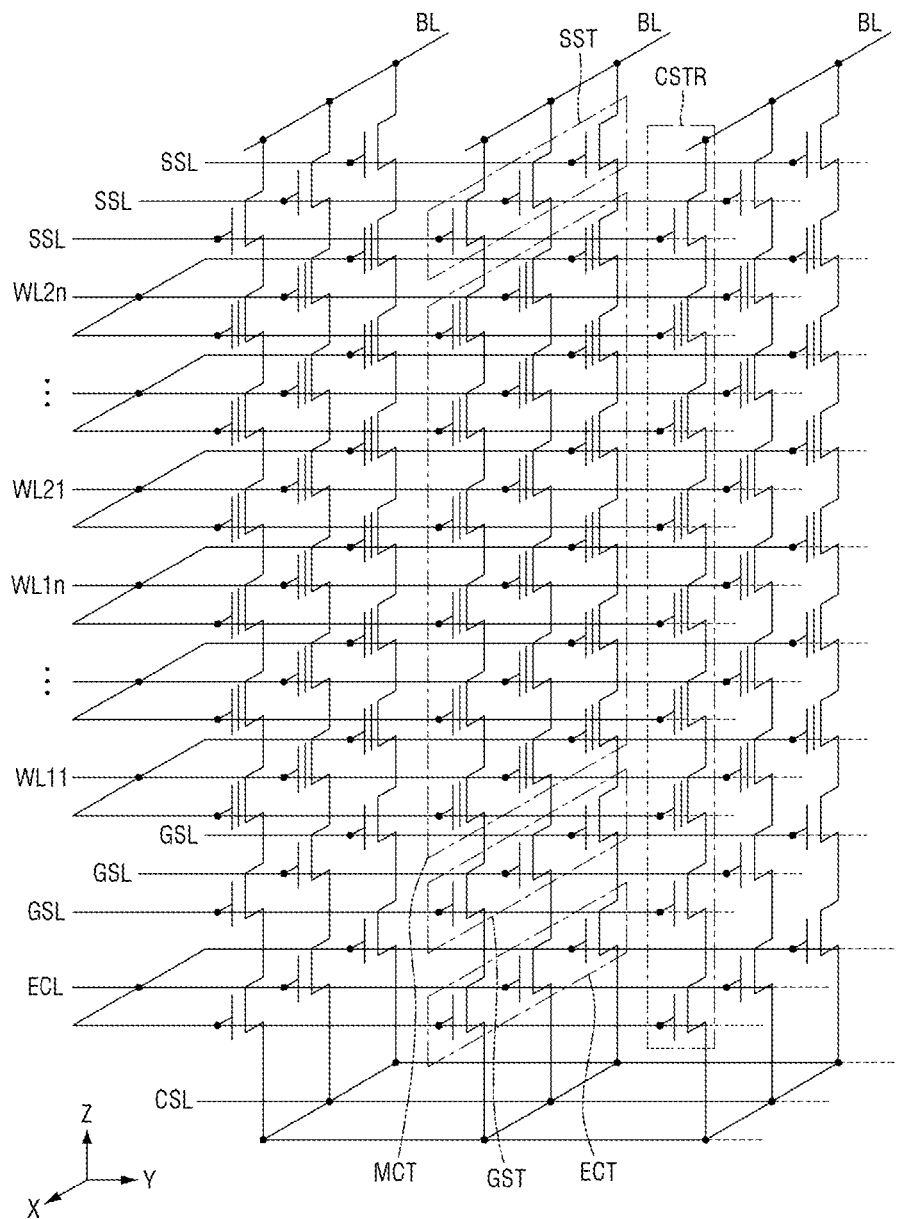
FIG. 1 is an example circuit diagram of a semiconductor memory device according to some embodiments.

FIG. 1 is an example circuit diagram of a semiconductor memory device according to some embodiments.

Referring to FIG. 1, a memory cell array of a semiconductor memory device according to some embodiments may include a common source line CSL, a plurality of bit lines BL, and a plurality of cell strings CSTR.

The plurality of bit lines BL may be arranged two-dimensionally. For example, the bit lines BL may be spaced apart from each other and each extend in a first direction X. The plurality of cell strings CSTR may be connected in parallel to each bit line BL. The cell strings CSTR may be connected in common to the common source line CSL. That is, a plurality of cell strings CSTR may be placed between the bit lines BL and the common source line CSL.

The common source line CSL may extend in a second direction Y, which intersects the first direction X. In some embodiments, a plurality of common source lines CSL may be arranged two-dimensionally. For example, the plurality of common source lines CSL may be spaced apart from each other and may each extend in the second direction Y. The same voltage may be applied electrically to the common source lines CSL. Alternatively, different voltages may be applied to the common source lines CSL, and the common source lines CSL may be controlled separately.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST, and the memory cell transistors MCT may be connected in series.

The common source line CSL may be commonly connected to sources of the ground selection transistors GST. Also, a ground selection line GSL, a plurality of word lines WL1n to WL1n and WL21 to WL2n, and a string selection line SSL may be placed between the common source line CSL and the bit line BL. The ground selection line GSL may be used as a gate electrode of the ground selection transistor GST. The word lines WL11 to WL1n and WL21 to WL2n may be used as gate electrodes of the memory cell transistors MCT. The string selection line SSL may be used as the gate electrode of the string selection transistor SST.

In some embodiments, an erasure control transistor ECT may be placed between the common source line CSL and the ground selection transistor GST. The common source line CSL may be commonly connected to the sources of the erasure control transistor ECT. Further, although an erasure control line ECL may be placed between the common source line CSL and the ground selection line GSL, this is merely an example. For example, the erasure control line ECL may be placed between the string selection line SSL and the bit line BL. The erasure control line ECL may be used as the gate electrode of the erasure control transistor ECT. The erasure control transistors ECT may generate a gate induced drain leakage (GIDL) to perform the erasure operation of the memory cell array.

Figure 6:
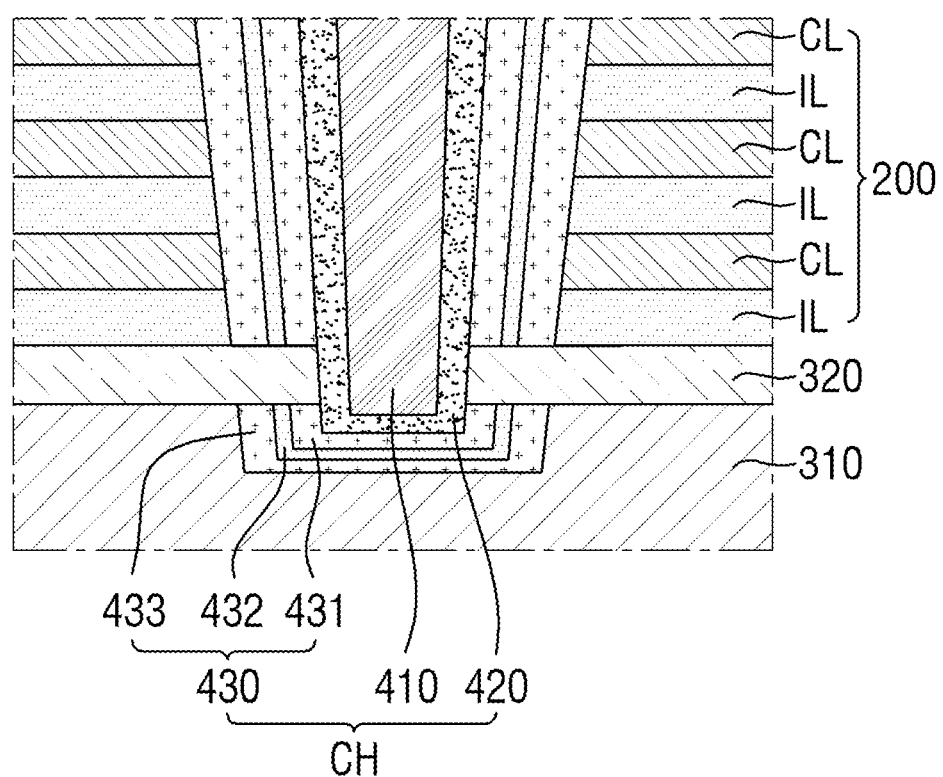
FIGS. 6 and 7 are various enlarged views of region μl in FIG. 2.
Figure 7:
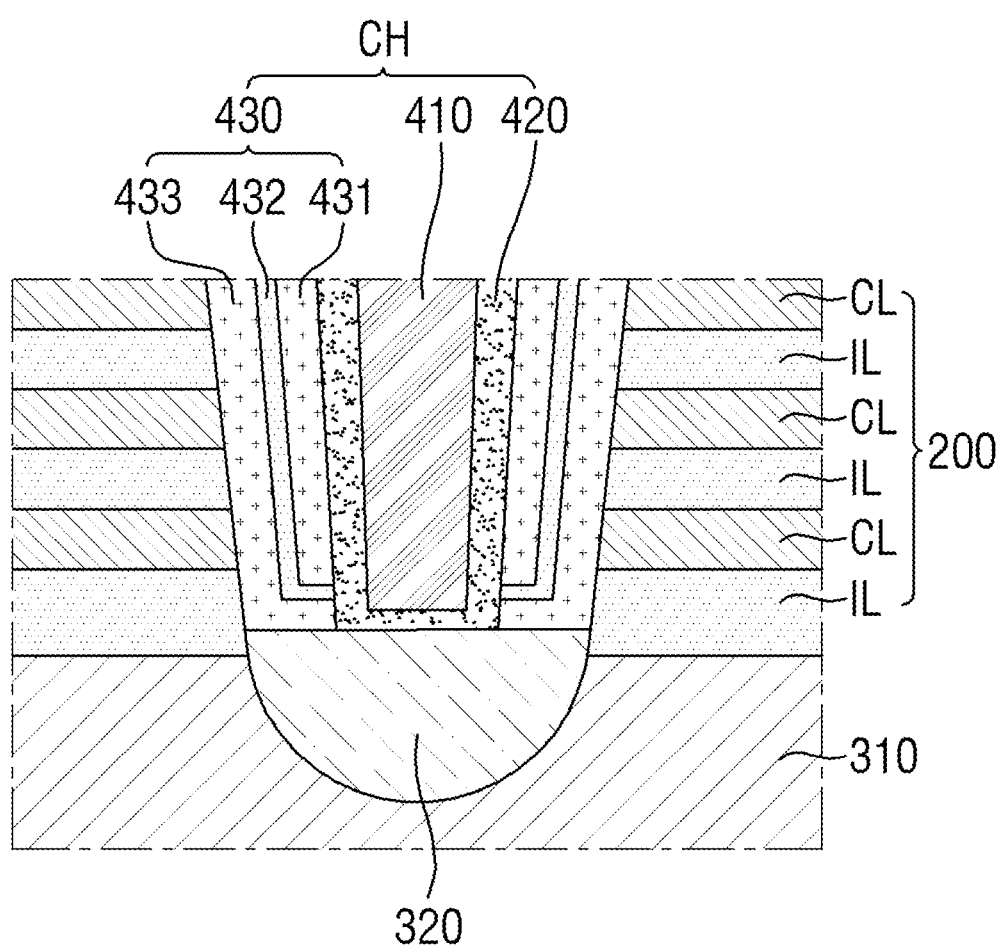

FIGS. 2 to 5 are schematic cross-sectional views of the semiconductor memory device according to some embodiments. FIGS. 6 and 7 are various enlarged views of region E1 of FIG. 2.

Figure 2:
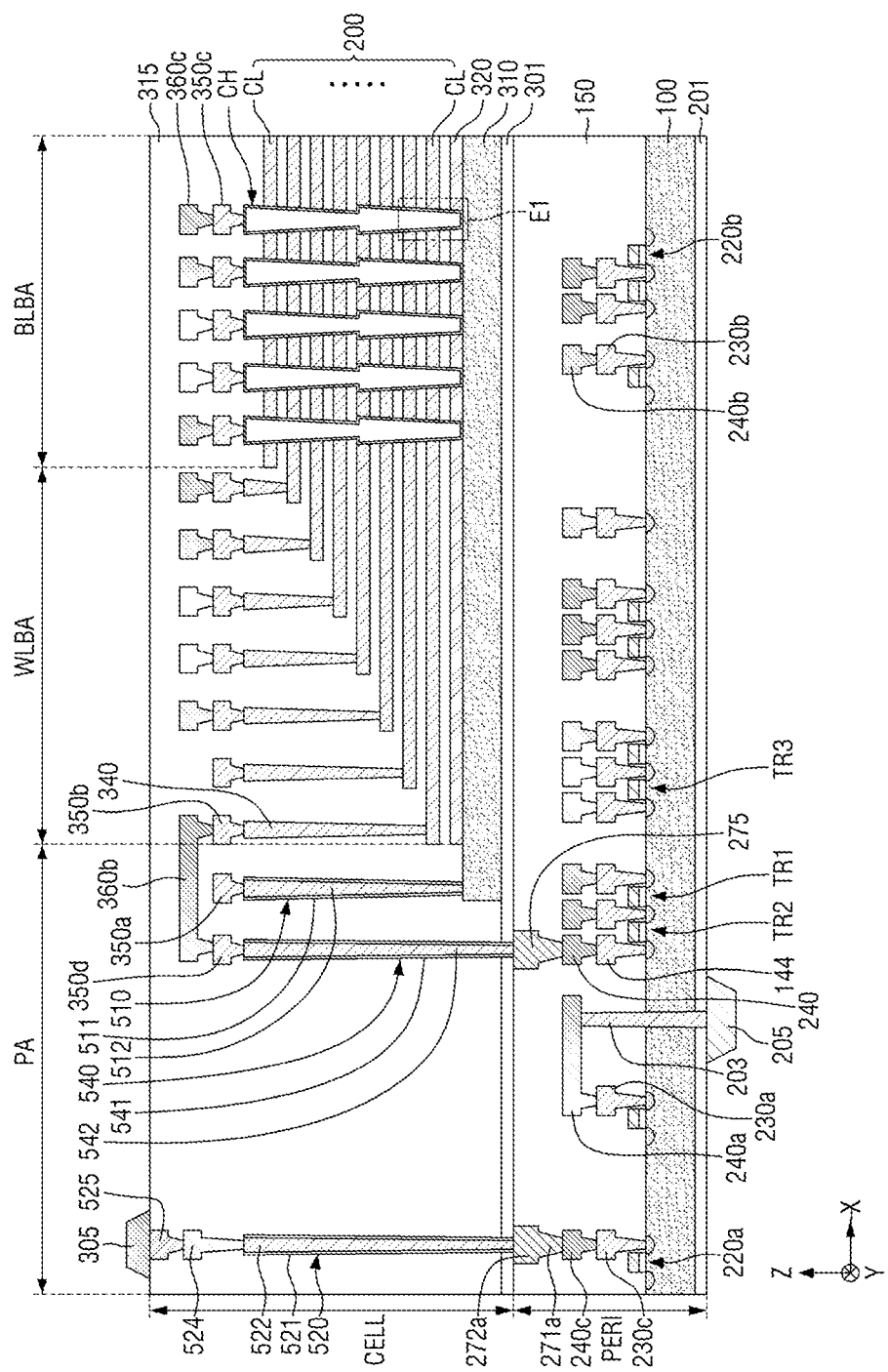
FIGS. 2 to 5 are schematic cross-sectional views of the semiconductor memory device according to some embodiments.
Figure 3:
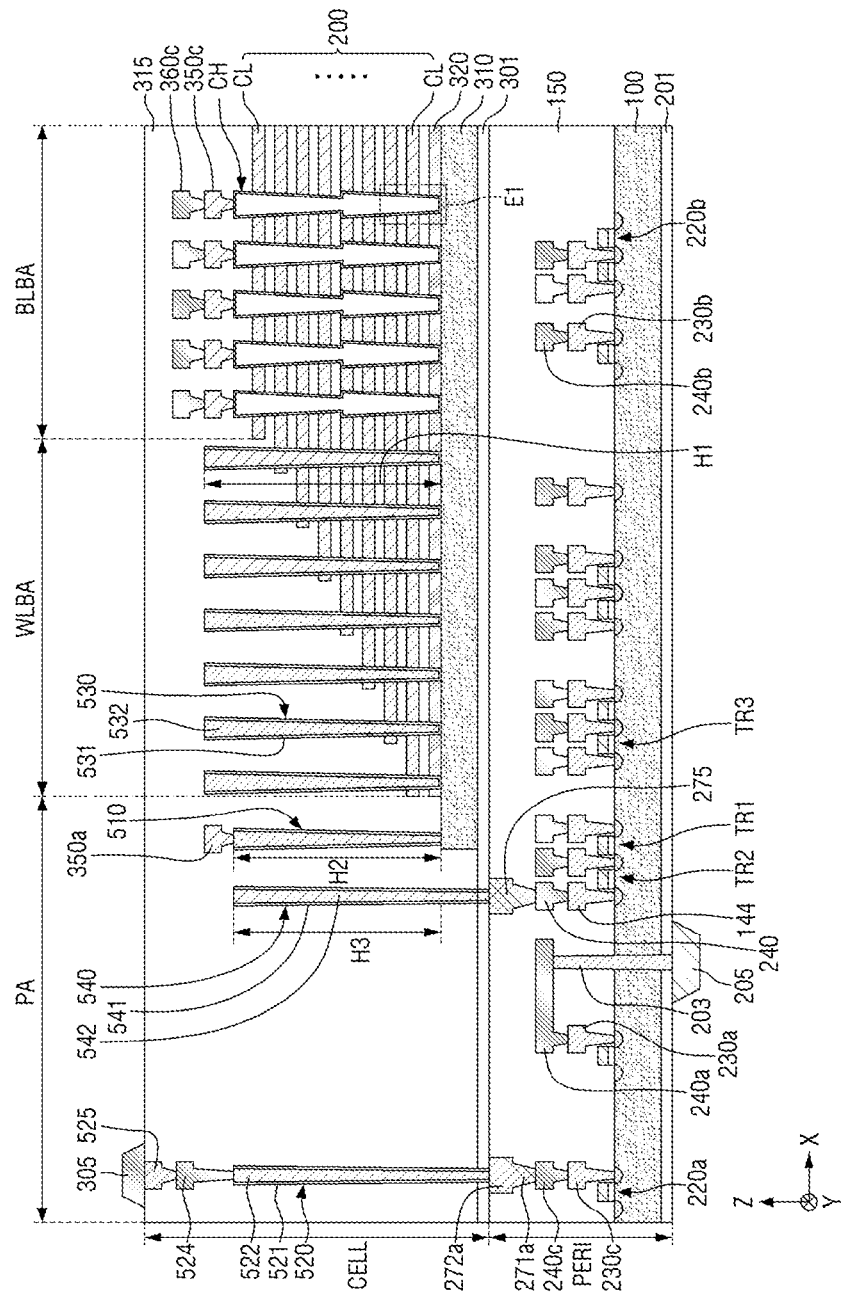
Figure 4:
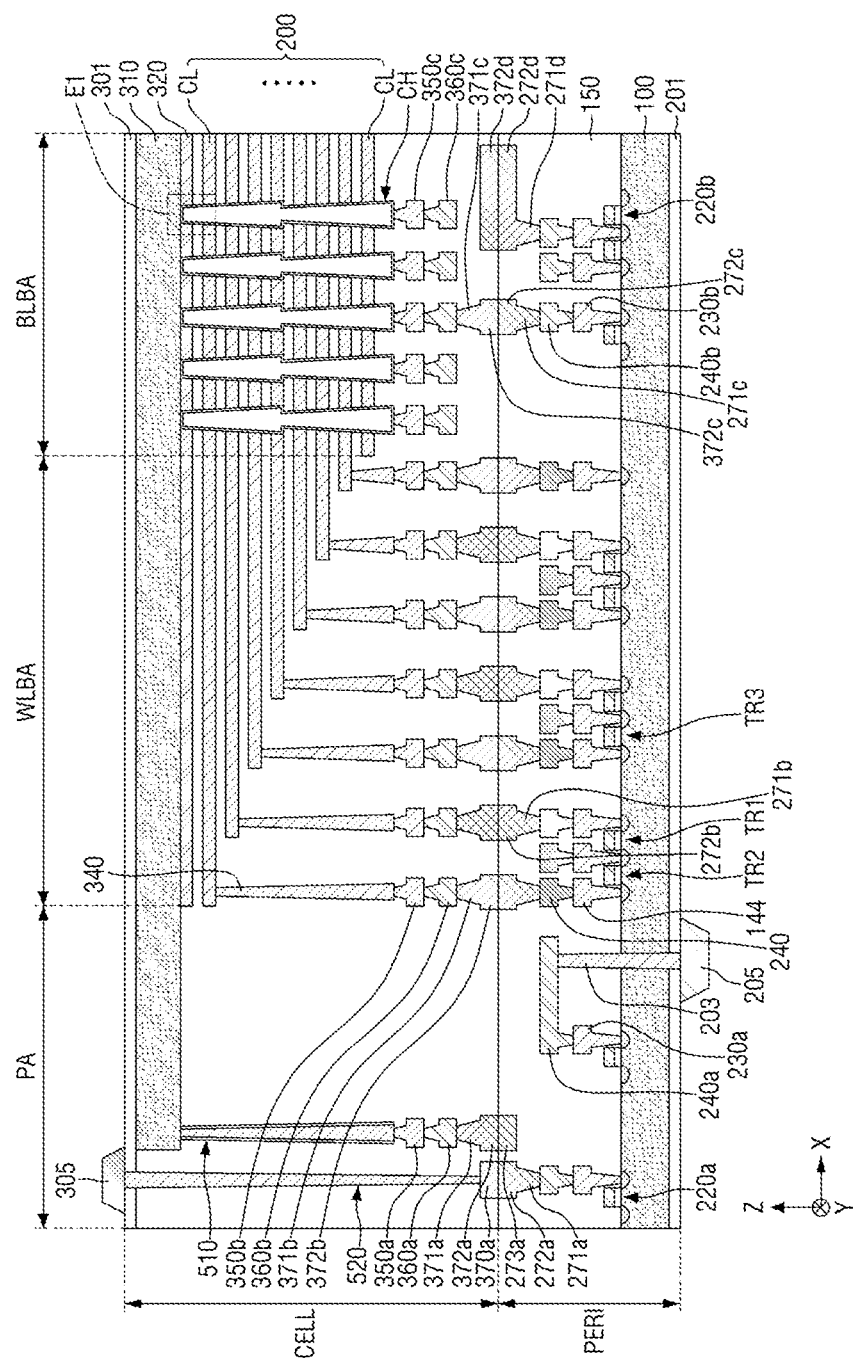
Figure 5:
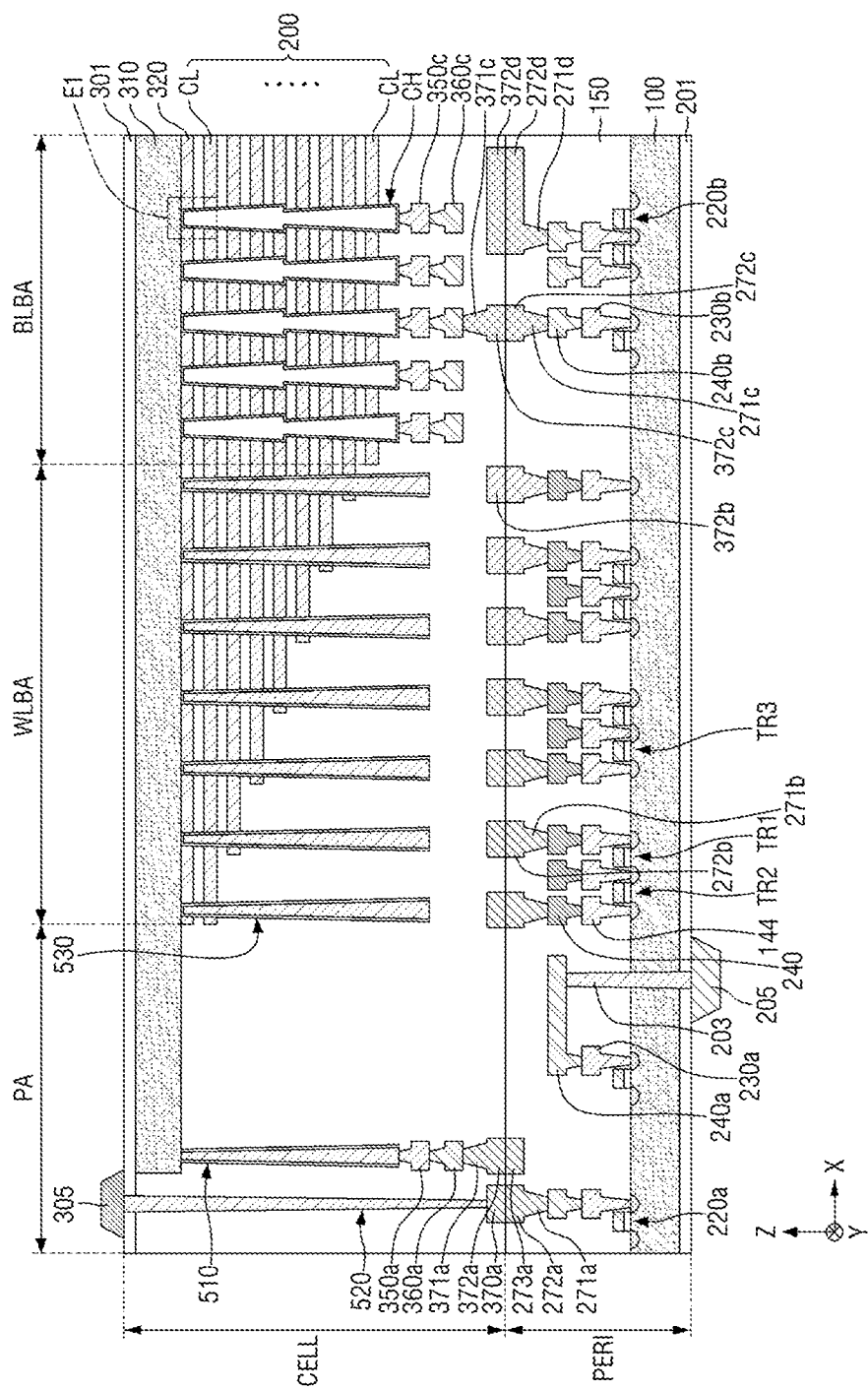

For reference, FIGS. 2 and 4 are diagrams showing cell contact plugs 340 in the word line bonding region WLBA, and FIGS. 3 and 5 are diagrams showing a dummy conductive structure 530 in the word line bonding region WLBA. For example, FIGS. 2 and 3 illustrate different regions of a same substrate that include cell contact plugs 340 and dummy conductive structures 530 through the word line bonding region WLBA, respectively. In another example, FIGS. 4 and 5 illustrate another embodiments of different regions of a same substrate that include cell contact plugs 340 and dummy conductive structures 530 through the word line bonding region WLBA, respectively.

Referring to FIG. 2, in the semiconductor memory device according to some embodiments, a peripheral circuit and a plurality of metal layers may be placed between a first substrate 100 and a second substrate 310. The semiconductor memory device according to some embodiments may include a peripheral circuit region PERI and a cell region CELL. The cell region CELL may be placed on the peripheral circuit region PERI. Each of the peripheral circuit region PERI and the cell region CELL of the semiconductor memory device may include an external pad bonding region PA, a word line bonding region WLBA, and a bit line bonding region BLBA.

The peripheral circuit region PERI may include the first substrate 100, a first interlayer insulating film 150, a plurality of circuit elements TR1, TR2, TR3, 220a and 220b formed on the first substrate 100, first metal layers 144, 230a, and 230b connected to each of the plurality of circuit elements TR1, TR2, TR3, 220a, and 220b, second metal layers 240, 240a, 240b and 240c formed on the first metal layers 144, 230a and 230b, and lower metals 271a, 272a and 275 formed on the second metal layers 240 and 240c.

In some embodiments, the first to third circuit elements TR1, TR2 and TR3 may provide a decoder circuit in the peripheral circuit region PERI. In some embodiments, a fourth circuit element 220a may provide a logic circuit in the peripheral circuit region PERI. In some embodiments, a fifth circuit element 220b may provide a page buffer in the peripheral circuit region PERI.

At least one or more metal layers may be further formed on the second metal layers 240, 240a, 240b and 240c. For example, the lower metals 271a, 272a and 275 may be formed on the second metal layers 240c and 240. The lower metals 271a and 272a may be electrically connected to a second I/O contact plug 520, and the lower metal 275 may be electrically connected to a connecting contact plug 540.

The lower metals 271a and 272a may be formed of, e.g., aluminum, copper, tungsten or the like. At least a part of one or more metal layers formed on the upper part of the second metal layers 240, 240a, 240b and 240c may be formed of aluminum or the like having a lower resistance than that of copper which forms the second metal layers 240, 240a, 240b and 240c. In some embodiments, the first metal layers 144, 230a and 230b may be formed of tungsten, which has a relatively high resistance, and the second metal layers 240, 240a, 240b and 240c may be formed of copper having relatively low resistance.

The first interlayer insulating film 150 may wrap the plurality of circuit elements TR1, TR2, TR3, 220a and 220b, the first metal layers 144, 230a and 230b, and the second metal layers 240, 240a, 240b and 240c. The first interlayer insulating film 150 may be placed on the first substrate 100. The first interlayer insulating film 150 may include an insulating material, e.g., a silicon oxide or a silicon nitride.

The cell region CELL may provide at least one memory block. The cell region CELL may include the second substrate 310 and a common source line 320. A plurality of word lines may be stacked on the second substrate 310 along a vertical direction, e.g., along a third direction Z, that intersects an upper surface of the second substrate 310. The second substrate 310 may include the bit line bonding region BLBA, the word line bonding region WLBA, and the external pad bonding region PA.

In the bit line bonding region BLBA, the channel structure CH may extend in a direction perpendicular to the upper surface of the second substrate 310, e.g., along the third direction Z. The channel structure CH may penetrate the word lines, the string selection lines, and the ground selection line. The channel structure CH may include a data storage layer, a channel layer, a buried insulating layer, and the like. The channel layer may be electrically connected to the first metal layer 350c and the second metal layer 360c. For example, the first metal layer 350c may be a bit line contact, and the second metal layer 360c may be a bit line. In an embodiment, the bit line 360c may extend along a first direction (a Y-axis direction) parallel to the upper surface of the second substrate 310.

In the word line bonding region WLBA, the word lines may extend along a second direction (an X-axis direction) parallel to the upper surface of the second substrate 310. The word lines may extend with different lengths. The word lines may be connected to the cell contact plugs 340. A first metal layer 350b and a second metal layer 360b may be connected sequentially to the upper part of the cell contact plugs 340 connected to the word lines. For example, as illustrated in FIG. 2, the first metal layers 350b, 350d may be positioned on tops of the cell contact plug 340 and the connecting contact plug 540, and the second metal layer 360b may connect therebetween.

The cell contact plugs 340 may be electrically connected to the circuit elements TR1, TR2 and TR3 that provide the row decoder in the peripheral circuit region PERI, e.g., the cell contact plug 340 may connect the stacked structure 200 to the peripheral circuit region PERI through the connecting contact plug 540. In an embodiment, the operating voltages of the circuit elements TR1, TR2 and TR3 that provide the row decoder may differ from the operating voltage of the circuit elements 220b that provide the page buffer. As an example, the operating voltage of the circuit elements 220b that provide the page buffer may be greater than the operating voltage of the circuit elements TR1, TR2 and TR3 that provide the row decoder.

The plurality of word lines may constitute a stacked structure 200, e.g., and correspond to a gate layer CL. The string selection line and the ground selection line may be placed at the upper part and the lower part of the word lines in the stacked structure 200, respectively. The plurality of word lines may be placed between the string selection line and the ground selection line in the stacked structure 200.

A plate contact plug 510, a second I/O contact plug 520, and a connecting contact plug 540 may be placed in the external pad bonding region PA.

The plate contact plug 510 may be placed inside a second interlayer insulating film 315. The plate contact plug 510 may extend to the second substrate 310 in the third direction Z. The plate contact plug 510 may be connected to the second substrate 310 on the external pad bonding region PA in which the stacked structure 200 is not placed, e.g., the plate contact plug 510 may be connected to an upper surface of the second substrate 310 in a region not covered by the stacked structure 200. A first metal layer 350a may be formed on the plate contact plug 510. The plate contact plug 510 may include a first spacer 511 and a first conductive core pattern 512.

The first spacer 511 may extend in the third direction Z. The first spacer 511 may extend along the side surfaces of the first conductive core pattern 512. The first spacer 511 may include, e.g., an insulating material.

The first conductive core pattern 512 may be placed along the inner side surface of the first spacer 511. The first conductive core pattern 512 may fill the inside of the first spacer 511. The first conductive core pattern 512 may be formed of a conductive material, e.g., a metal, a metal compound or polysilicon. The first conductive core pattern 512 may be connected to the second substrate 310. The first conductive core pattern 512 may be electrically connected to the second substrate 310.

The second I/O contact plug 520 may be placed inside the second interlayer insulating film 315. The second I/O contact plug 520 may be connected to the lower metals 271a and 272a, a third metal layer 524, and a fourth metal layer 525. The second I/O contact plug 520 may be connected to the second I/O pad 305 through the lower metals 271a and 272a. The second I/O contact plug 520 may be connected to at least one of the circuit elements 220a and 220b through the third metal layer 524 and the fourth metal layer 525. The second I/O contact plug 520 may include a second spacer 521 and a second conductive core pattern 522.

The second spacer 521 may extend in the third direction Z. The second spacer 521 may extend along the side surfaces of the second conductive core pattern 522. The second spacer 521 may include, e.g., an insulating material.

The second conductive core pattern 522 may be placed along the inner side surface of the second spacer 521. The second conductive core pattern 522 may fill the inside of the second spacer 521. The second conductive core pattern 522 may be formed of a conductive material, e.g., a metal, a metal compound or polysilicon. The second conductive core pattern 522 may be connected to the lower metals 271a and 272a. The second conductive core pattern 412 may be electrically connected to the lower metals 271a and 272a.

The connecting contact plug 540 may be placed inside the second interlayer insulating film 315. A first metal layer 350d may be connected to the lower metal 275 through the connecting contact plug 540. The first metal layer 350d may be connected to the first metal layer 350b connected to the cell contact plug 340, by the second metal layer 360b. Accordingly, the plurality of circuit elements TR1, TR2 and TR3 may be electrically connected to the word line. The connecting contact plug 540 may include a third spacer 541 and a third conductive core pattern 542.

The third spacer 541 may extend in the third direction Z. The third spacer 541 may extend along the side surfaces of the third conductive core pattern 542. The third spacer 541 may include, e.g., an insulating material.

The third conductive core pattern 542 may be placed along the inner side surface of the third spacer 541. The third conductive core pattern 542 may fill the inside of the third spacer 541. The third conductive core pattern 542 may be formed of a conductive material, e.g., a metal, a metal compound or polysilicon. The third conductive core pattern 542 may be connected to the lower metal 275. The third conductive core pattern 542 may be electrically connected to the lower metal 275.

The second interlayer insulating film 315 may wrap, e.g., cover, the stacked structure 200, the channel structure CH, the cell contact plug 340, the plate contact plug 510, the second I/O contact plug 520, the dummy conductive structure 530, and the plurality of metal layers 350b, 350c, 350d, 360b, 360c, 524, and 525. The second interlayer insulating film 315 may be placed on the first interlayer insulating film 150. The second interlayer insulating film 315 may include an insulating material, e.g., a silicon oxide or a silicon nitride.

On the other hand, I/O pads 205 and 305 may be placed in the external pad bonding region PA. A lower insulating film 201 that covers the lower surface of the first substrate 100 may be formed below the first substrate 100. The first I/O pad 205 may be formed on the lower insulating film 201. The first I/O pad 205 may be connected to at least one of a plurality of circuit elements 220a and 220b placed in the peripheral circuit region PERI through the first I/O contact plug 203. The first I/O pad 205 may be separated from the first substrate 100 by the lower insulating film 201. Further, a side insulating film may be placed between the first I/O contact plug 203 and the first substrate 100. The side insulating film may electrically separate the first I/O contact plug 203 and the first substrate 100.

An upper insulating film 301 that covers the upper surface of the second substrate 310 may be formed on the upper part of the second substrate 310, e.g., the upper insulating film 301 may be formed between the second substrate 310 and the first interlayer insulating film 150. The second I/O pad 305 may be placed on the upper insulating film 301. The second I/O pad 305 may be connected to at least one of a plurality of circuit elements 220a and 220b placed in the peripheral circuit region PERI through the second I/O contact plug 520.

Depending on the embodiments, the second substrate 310, the common source line 320 and the like may not be placed in the region in which the second I/O contact plug 520 is placed. Also, the second I/O pad 305 may not overlap the word lines of the stacked structure 200 in the third direction Z. The second I/O contact plug 520 may be separated from the second substrate 310 in a direction parallel to the upper surface of the second substrate 310, e.g., the second I/O contact plug 520 may be spaced apart from the second substrate 310 in the second direction X. The upper surface of the second I/O contact plug 520 may be electrically connected to the third metal layer 524. The second I/O contact plug 520 may be placed in the second interlayer insulating film 315 of the cell region CELL. The second I/O contact plug 520 may be electrically connected to the second I/O pad 305 through the third metal layer 524.

A metal pattern of an uppermost metal layer exists as a dummy pattern in each of the external pad bonding region PA and the bit line bonding region BLBA included in each of the cell region CELL and the peripheral circuit region PERI, or the uppermost metal layer may be emptied.

An upper metal pattern 372d having the same shape as the lower metal pattern 272d of the peripheral circuit region PERI may be formed on the uppermost metal layer of the cell region CELL. The upper metal pattern 372d may correspond to a lower metal pattern 272d formed on the uppermost metal layer of the peripheral circuit region PERI in the bit line bonding region BLBA. No contact may be formed on the upper metal pattern 372d formed in the uppermost metal layer of the cell region CELL.

Referring to FIG. 3, the dummy conductive structure 530 may be placed in the word line bonding region WLBA, e.g., in a region of the second substrate 310 where the cell contact plugs 340 are not placed. For example, the term "dummy" refers to a configuration having a structure and shape identical or similar to other components, not practically functioning inside the semiconductor memory device. That is, an electrical signal is not applied to the dummy conductive structure 530, i.e., the top of the dummy conductive structure 530 is covered by an insulating layer and is not electrically connected to other components (e.g., does not perform an electrically specific function).

The dummy conductive structure 530 may be placed in, e.g., through, the second interlayer insulating film 315 and the stacked structure 200. The dummy conductive structure 530 may extend to the second substrate 310 in the third direction Z. The dummy conductive structure 530 may include a dummy spacer 531 and a dummy conductive core pattern 532.

The dummy spacer 531 may extend in the third direction Z. The dummy spacer 531 may extend along the side surfaces of the dummy conductive core pattern 532. The dummy spacer 531 may include, e.g., an insulating material.

The dummy spacer 531 may include the same insulating material as at least one of the first spacer 511 and the second spacer 521.

The dummy conductive core pattern 532 may be placed along the inner side surface of the dummy spacer 531. The dummy conductive core pattern 532 may fill the inside of the dummy spacer 531. The dummy conductive core pattern 532 may be formed of a conductive material, e.g., a metal, a metal compound or polysilicon.

A height of the upper surface of the dummy conductive structure 530 and a height of the upper surface of the plate contact plug 510 may differ from each other, on the basis of the upper surface of the second substrate 310. That is, as illustrated in FIG. 3, a distance from the upper surface of the dummy conductive structure 530 to the upper surface of the second substrate 310 along the third direction may be different from a distance from the upper surface of the plate contact plug 510 to the upper surface of the second substrate 310.

In detail, the height of the dummy conductive structure 530 may be a first height H1 on the basis of, e.g., as measured from (or relative to), the upper surface of the second substrate 310. The height of the plate contact plug 510 may be a second height H2 on the basis of, e.g., as measured from, the upper surface of the second substrate 310. The height of the connecting contact plug 540 may be a third height H3 on the basis of, e.g., as measured from, the upper surface of the second substrate 310.

The first height H1 may differ from the second height H2 and the third height H3. In detail, the first height H1 may be greater than each of the second height H2 and the third height H3. In the semiconductor memory device according to some embodiments, the plate contact plug 510 has the second height H2 that is different from the first height H1, and may include the first conductive core pattern 512 and the first spacer 511 extending along the side surfaces of the first conductive core pattern 512.

Referring to FIGS. 4 and 5, the semiconductor memory device according to some embodiments may have a chip-to-chip (C2C) structure. The C2C structure refers to a structure in which an upper chip including the cell region CELL is manufactured on a first wafer and a lower chip including the peripheral circuit region PERI is manufactured on a second wafer different from the first wafer, and then, the upper chip and the lower chip are connected to each other, e.g., via a bonding way. As an example, the bonding way may refer to electrically connecting to each other a bonding metal on an uppermost metal layer of the upper chip and a bonding metal on an uppermost metal layer of the lower chip. For example, when the bonding metal is formed of copper (Cu), the bonding way may be a Cu—Cu bonding way, and the bonding metal may also be formed of aluminum or tungsten.

As illustrated in FIGS. 4 and 5, in the semiconductor memory device according to some embodiments, the stacked structure 200 may be placed between the first substrate 100 and the second substrate 310.

For example, the bit line 360c may be electrically connected to the circuit elements 220b that provide a page buffer in the peripheral circuit region PERI in the bit line bonding region BLBA. As an example, the bit line 360c may be connected to the upper bonding metals 371c and 372c in the peripheral circuit region PERI, and the upper bonding metals 371c and 372c may be connected to the lower bonding metals 271c and 272c connected to the circuit elements 220b of the page buffer.

In the semiconductor memory device according to some embodiments, the lower bonding metals 271b and 272b may be formed on the second metal layer 240b of the word line bonding region WLBA. In the word line bonding region WLBA, the lower bonding metals 271b and 272b of the peripheral circuit region PERI may be electrically connected to the upper bonding metals 371b and 372b of the cell region CELL by the bonding way. The lower bonding metals 271b and 272b and the upper bonding metals 371b and 372b may be formed of, e.g., aluminum, copper, tungsten, or the like.

Referring to FIGS. 4 and 5, in the semiconductor memory device according to some embodiments, the second I/O contact plug 520 may not include a second spacer (521 of FIG. 2). For example, the second I/O contact plug 520 may be formed of a conductive material, e.g., such as metal, metal compound or polysilicon. The second I/O contact plug 520 may be electrically connected to the upper bonding metal 370a.

The channel structure CH of a semiconductor memory device according to some embodiments will be described referring to FIGS. 2, 6 and 7.

As illustrated in FIGS. 2, 6, and 7, the channel structure CH may extend in the third direction Z and be placed inside the stacked structure 200. The stacked structure 200 may include a plurality of word lines. The stacked structure 200 may be placed on the bit line bonding region BLBA and the word line bonding region WLBA of the second substrate 310. Although the channel structure CH may be formed as a multi-stack as shown in FIG. 2, embodiments are not limited thereto, e.g., the channel structure CH may be formed as a single stack.

The channel structure CH may be electrically connected to the first metal layer 350c and the second metal layer 360c. For example, the first metal layer 350c may be a bit line contact, and the second metal layer 360c may be a bit line. In some embodiments, the bit line 360c may extend along one direction (e.g., the second direction Y) parallel to the upper surface of the second substrate 310. In some embodiments, the bit line 360c may be electrically connected to a fifth circuit element 220b that provides a page buffer in the peripheral circuit region PERI. As illustrated in FIG. 6, the channel structure CH may include a core 410, a channel pattern 420, and an information storage film 430.

The core 410 may be formed to fill the inside of the cup-shaped channel pattern 420. The core 410 may include, e.g., insulating materials such as silicon oxides.

The channel pattern 420 may extend in the first direction Z. Although the channel pattern 420 is shown as a cup shape, this is merely an example, and the channel pattern 420 may also have various shapes, e.g., a cylindrical shape, a rectangular barrel shape, and a solid filler shape. For example, the channel pattern 420 may include a semiconductor material, e.g., single crystal silicon, polycrystalline silicon, organic semiconductor matter and carbon nanostructure.

The information storage film 430 may be interposed between the channel pattern 420 and the word lines. For example, the information storage film 430 may extend along the side surfaces of the channel pattern 420.

In some embodiments, the information storage film 430 may be formed by multi-films. For example, the information storage film 430 may include a tunnel insulating layer 431, a charge storage layer 432, and a barrier layer 433 that are sequentially stacked on the channel pattern 420. The tunnel insulating layer 431 may include, e.g., a silicon oxide or a high dielectric constant material (for example, aluminum oxide ($Al_2O_3$), and hafnium oxide ($HfO_2$)) having a higher dielectric constant than that of silicon oxide. The charge storage layer 432 may include, e.g., silicon nitride. The barrier layer 433 may include, e.g., a silicon oxide or a high dielectric constant material having a higher dielectric constant than that of silicon oxide.

The common source line 320 may be formed to be connected to the channel pattern 420 of the channel structure CH.

For example, as illustrated in FIG. 6, the channel pattern 420 may penetrate the common source line 320 and be buried in the second substrate 310. The common source line 320 may penetrate a part of the information storage film 430 and be connected to the side surfaces of the channel pattern 420, e.g., the common source line 320 may contact an outer lateral surface of the channel pattern 420.

In another example, as shown in FIG. 7, the common source line 320 may be connected to the lower surface of the channel pattern 420. For example, the common source line 320 may extend along and in direct contact with lowermost surfaces of the channel pattern 420 and the information storage film 430.

At least a part of the common source line 320 may be buried inside the second substrate 310. The common source line 320 may be formed, e.g., from a second substrate 310 by a selective epitaxial growth (SEG) process. The channel pattern 420 may penetrate a part of the information storage film 430 and be connected to the upper surface of the common source line 320.

FIGS. 8 to 15 are cross-sectional views of stages in a method for fabricating a semiconductor memory device according to some embodiments. Repeated explanation of contents of above-described elements and embodiments will be simplified or omitted. It is noted that the cross-sections in FIGS. 8 to 15 correspond to the cross-sectional view in FIG. 3.

Figure 8:
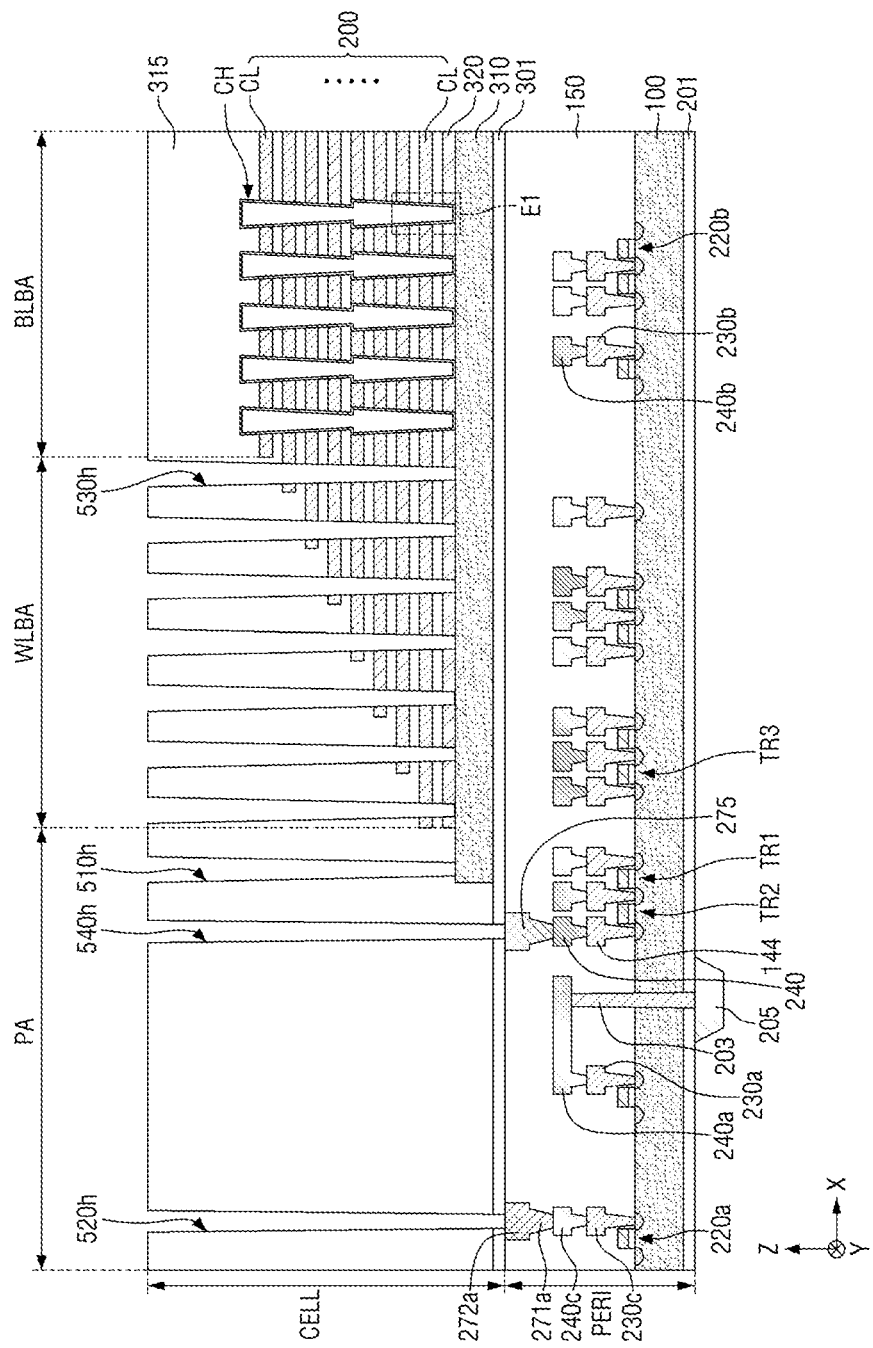
FIGS. 8 to 15 are cross-sectional views of stages in a method for fabricating a semiconductor memory device according to some embodiments.

Referring to FIG. 8, the peripheral circuit region PERI may be formed on the first substrate 100 and covered with the first interlayer insulating film 150, and the second substrate 310 with the stacked structure 200 and the channels CH may be bonded to the top of the first interlayer insulating film 150. The second interlayer insulating film 315 may be formed to cover the stacked structure 200 and the channels CH. Next, a plate contact hole 510h, a second I/O contact hole 520h, a plurality of dummy holes 530h, and a connecting contact hole 540h may be formed through the second interlayer insulating film 315 to fabricate the semiconductor memory device according to some embodiments, as will be described in more detail below.

The plate contact hole 510h through the second interlayer insulating film 315 may be formed on the external pad bonding region PA. The plate contact hole 510h may be connected to the second substrate 310, e.g., the plate contact hole 510h may extend through the second interlayer insulating film 315 to expose an upper surface of the second substrate 310. The plate contact hole 510h may extend in the third direction Z.

The second I/O contact hole 520h through the second interlayer insulating film 315 and the upper insulating film 301 may be formed on the external pad bonding region PA. The second I/O contact hole 520h may extend in the third direction Z. The second I/O contact hole 520h may be connected to the lower metals 271a and 272a, e.g., the second I/O contact hole 520h may expose an upper surface of the lower metal 272a.

The connecting contact hole 540h through the second interlayer insulating film 315 and the upper insulating film 301 may be formed on the external pad bonding region PA. The connecting contact hole 540h may extend in the third direction Z. The connecting contact hole 540h may be connected to the lower metal 275, e.g., the connecting contact hole 540h may expose an upper surface of the lower metal 275.

A plurality of dummy holes 530h penetrating through the second interlayer insulating film 315 and the stacked structure 200 may be formed on the word line bonding region WLBA. A dummy hole 530h may extend in the third direction Z, e.g., each of the plurality of dummy holes 530h may expose an upper surface of the second substrate 310.

Figure 9:
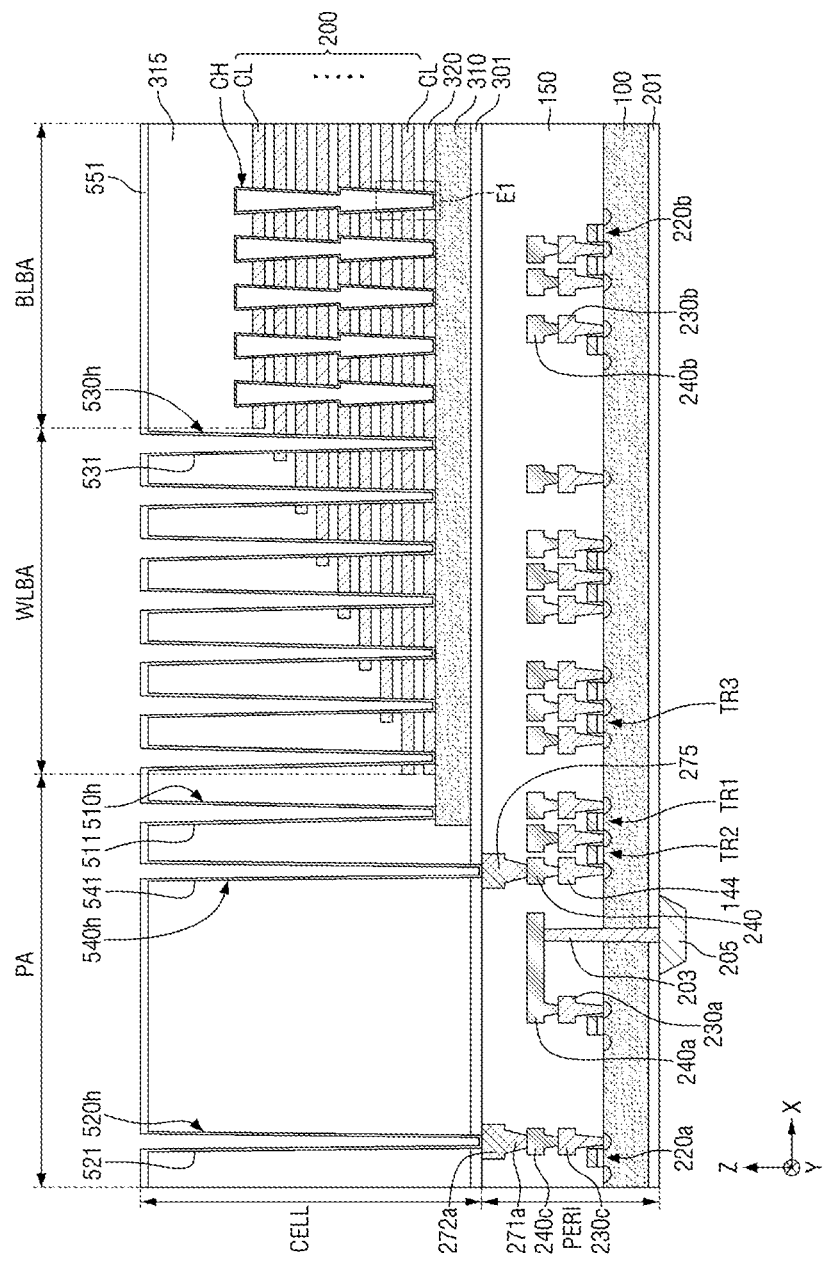

Referring to FIG. 9, the first spacer 511, the second spacer 521, the dummy spacer 531, the third spacer 541, and the spacer connection film 551 may be formed, e.g., simultaneously.

In detail, the first spacer 511 may extend along the profile of the plate contact hole 510h, e.g., the first spacer 511 may extend continuously and conformally along an entire bottom and inner sidewall of the plate contact hole 510h. At this time, the first spacer 511 may include a lower surface which is not removed.

The second spacer 521 may extend along the profile of the second I/O contact hole 520h, e.g., the second spacer 521 may extend continuously and conformally along an entire bottom and inner sidewall of the second I/O contact hole 520h. At this time, the second spacer 521 may include a lower surface which is not removed.

The dummy spacer 531 may extend along the profiles of the plurality of dummy holes 530h, e.g., each dummy spacer 531 may extend continuously and conformally along an entire bottom and inner sidewall of a corresponding one of the dummy holes 530h. At this time, the dummy spacer 531 may include a lower surface which is not removed.

The third spacer 541 may extend along the profile of the connecting contact hole 540h, e.g., the third spacer 541 may extend continuously and conformally along an entire bottom and inner sidewall of the connecting contact hole 540h. At this time, the third spacer 541 may include a lower surface which is not removed.

The spacer connection film 551 may be formed on the second interlayer insulating film 315. The spacer connection film 551 may connect the first spacer 511, the second spacer 521, the dummy spacer 531, and the third spacer 541. The first spacer 511, the second spacer 521, the dummy spacer 531, the third spacer 541 and the spacer connection film 551 may be integrally formed at the same time.

Figure 10:
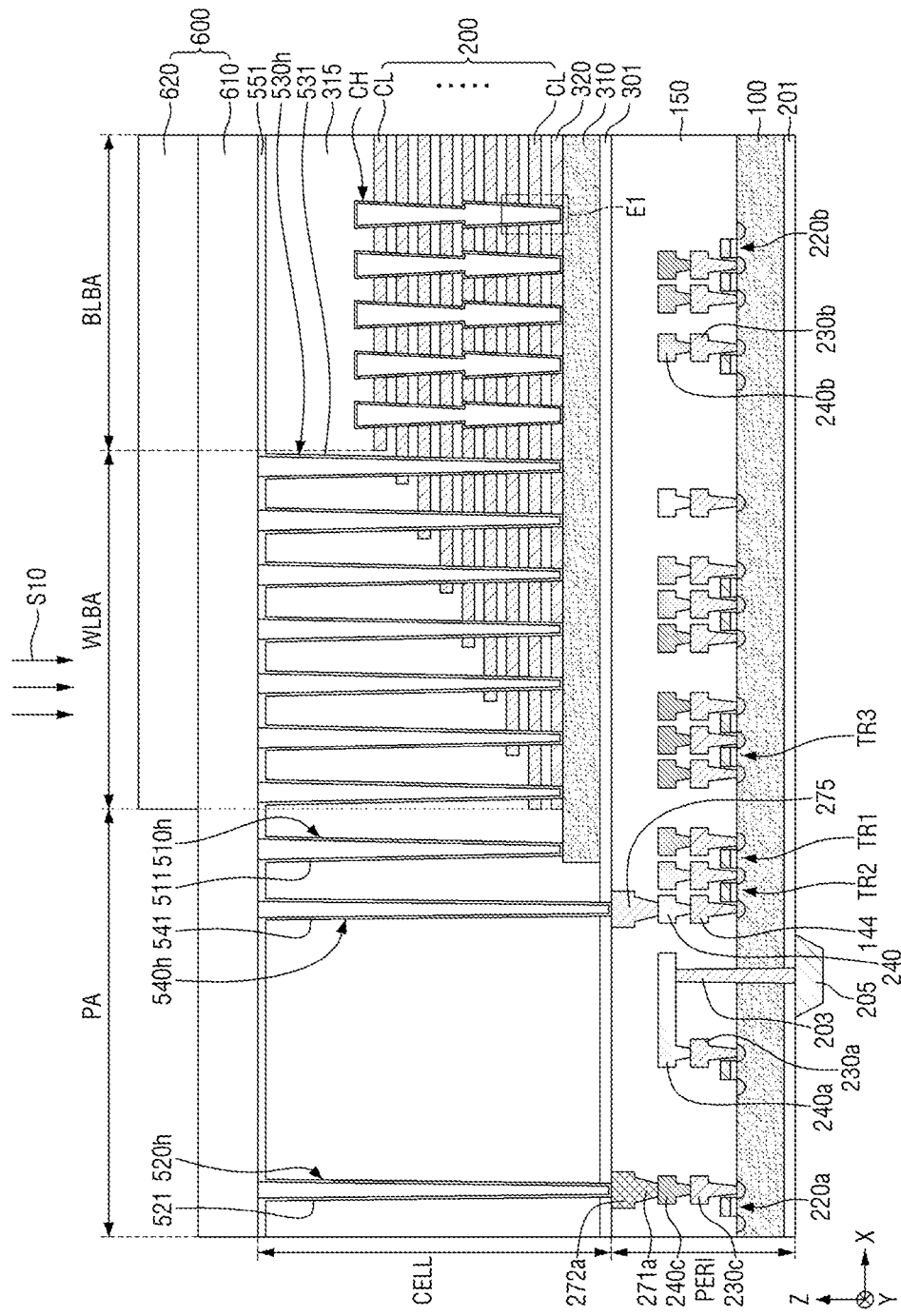

Referring to FIG. 10, a mask layer 600 for exposing the external pad bonding region PA may be formed. The mask layer 600 may include a first mask layer 610 and a second mask layer 620.

The first mask layer 610 may be formed on the spacer connection film 551. The first mask layer 610 may be placed, e.g., continuously, over the bit line bonding region BLBA, the word line bonding region WLBA, and the external pad bonding region PA. The first mask layer 610 may block the entrances, e.g., openings, of the plate contact hole 510h, the second I/O contact hole 520h, the dummy hole 530h, and the connecting contact hole 540h. The first mask layer 610 may be, e.g., an amorphous carbon layer. The first mask layer 610 may not enter the plate contact holes 510h, the second I/O contact holes 520h, the dummy hole 530h, and the connecting contact holes 540h, e.g., the first mask layer 610 may have a plate shape parallel to the second substrate 310 to only cover tops of the openings of the plate contact holes 510h, the second I/O contact holes 520h, the dummy hole 530h, and the connecting contact holes 540h without extending thereinto.

The second mask layer 620 may be formed on the first mask layer 610. The second mask layer 620 may be placed, e.g., only, over the bit line bonding region BLBA and the word line bonding region WLBA. Therefore, the second mask layer 620 may expose a portion of the first mask layer 610 on the external pad bonding region PA.

As further illustrated in FIG. 10, a primary etching process (S10) for etching the first mask layer 610 exposed by the second mask layer 620 may be performed. As a result, the second mask layer 620 and the portion of the first mask layer 610 on the external pad bonding region PA may be removed through the primary etching process (S10).

Figure 11:
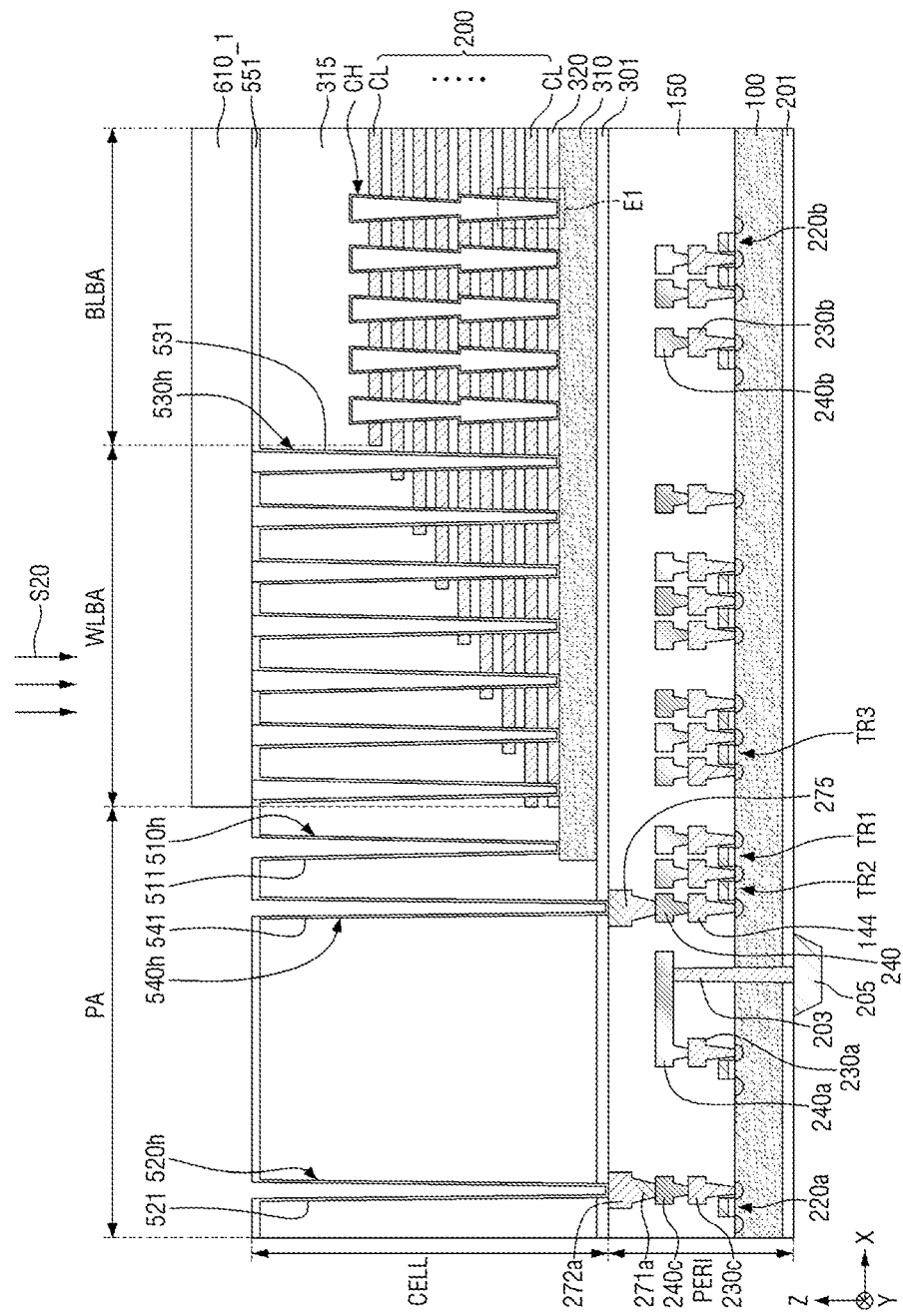

Therefore, referring to FIG. 11, the second mask layer 620 and the portion of the first mask layer 610 on the external pad bonding region PA may be completely removed, while a portion of the first mask layer 610 on the bit line bonding region BLBA and the word line bonding region WLBA may remain to form a partially removed first mask layer 610_1 over the bit line bonding region BLBA and the word line bonding region WLBA. The partially removed first mask layer 610_1 may expose the plate contact hole 510h, the second I/O contact hole 520h, and the connecting contact hole 540h placed on the external pad bonding region PA. That is, the lower surface of the first spacer 511, the lower surface of the second spacer 521, and the lower surface of the third spacer 541 may be exposed by the partially removed first mask layer 610_1.

Next, a secondary etching process (S20) for etching the exposed external pad bonding region PA exposed by the partially removed first mask layer 610_1 may be performed. That is, the lower surface of the first spacer 511 of the plate contact hole 510h, the lower surface of the second spacer 521 of the second I/O contact hole 520h, and the lower surface of the third spacer 541 of the connecting contact hole 540h may be removed by the secondary etching process (S20) to expose respective portions of the second substrate 310, the lower metal 272a, and the lower metal 275.

Figure 12:
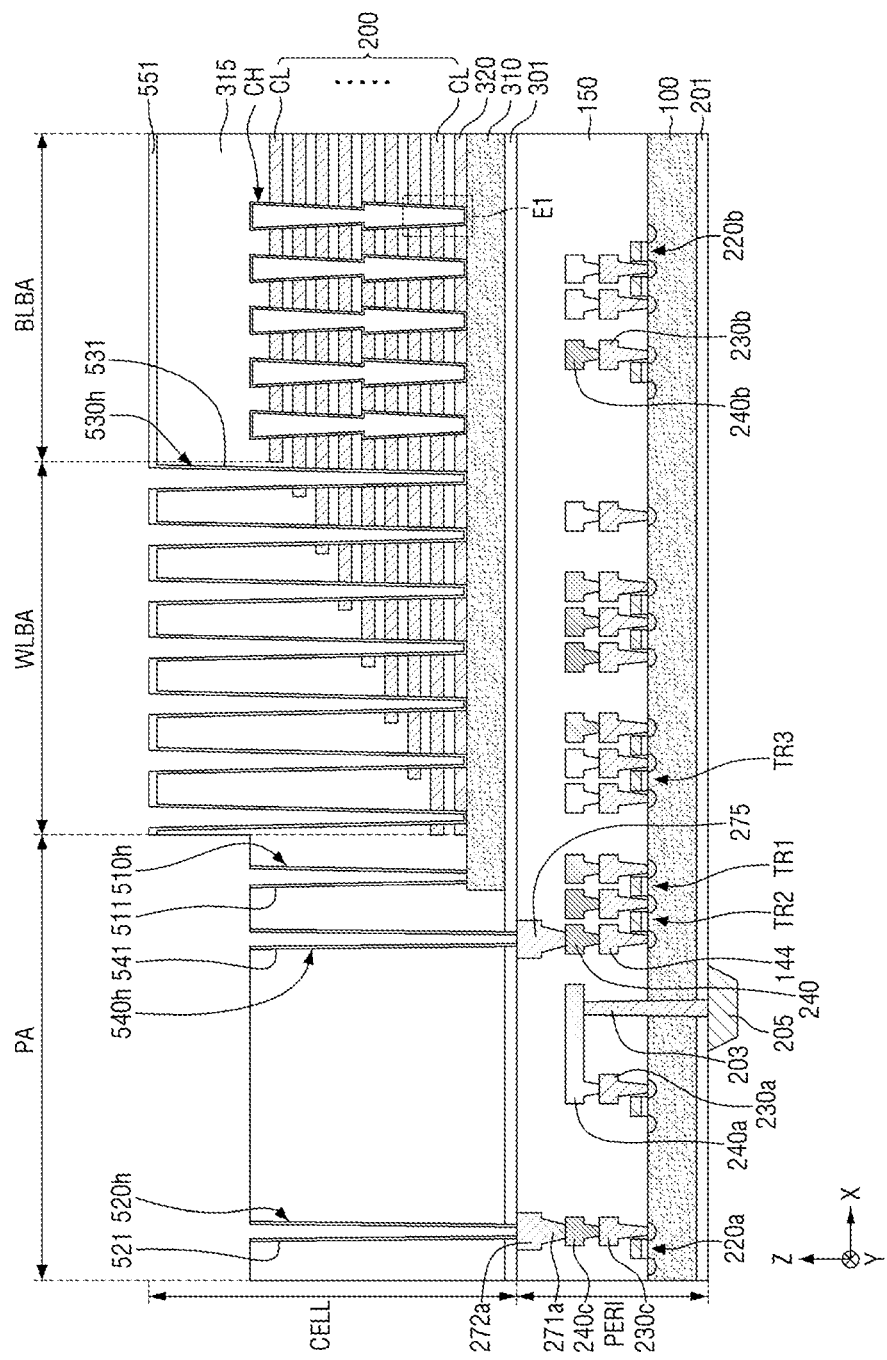

Accordingly, referring to FIG. 12, the plate contact hole 510h may be connected to the second substrate 310. The second I/O contact hole 520h may be connected to the lower metals 271a and 272a. The connecting contact hole 540h may be connected to the lower metal 275.

Further, a part of the first spacer 511, a part of the second spacer 521, a part of the third spacer 541, a part of the spacer connection film 551, and a part of the second interlayer insulating film 315 on the external pad bonding region PA may be removed by the secondary etching process (S20). Accordingly, the upper surfaces of the plate contact hole 510h, the second I/O contact hole 520h, and the connecting contact hole 540h may become lower than the upper surface of the dummy hole 530h.

Figure 13:
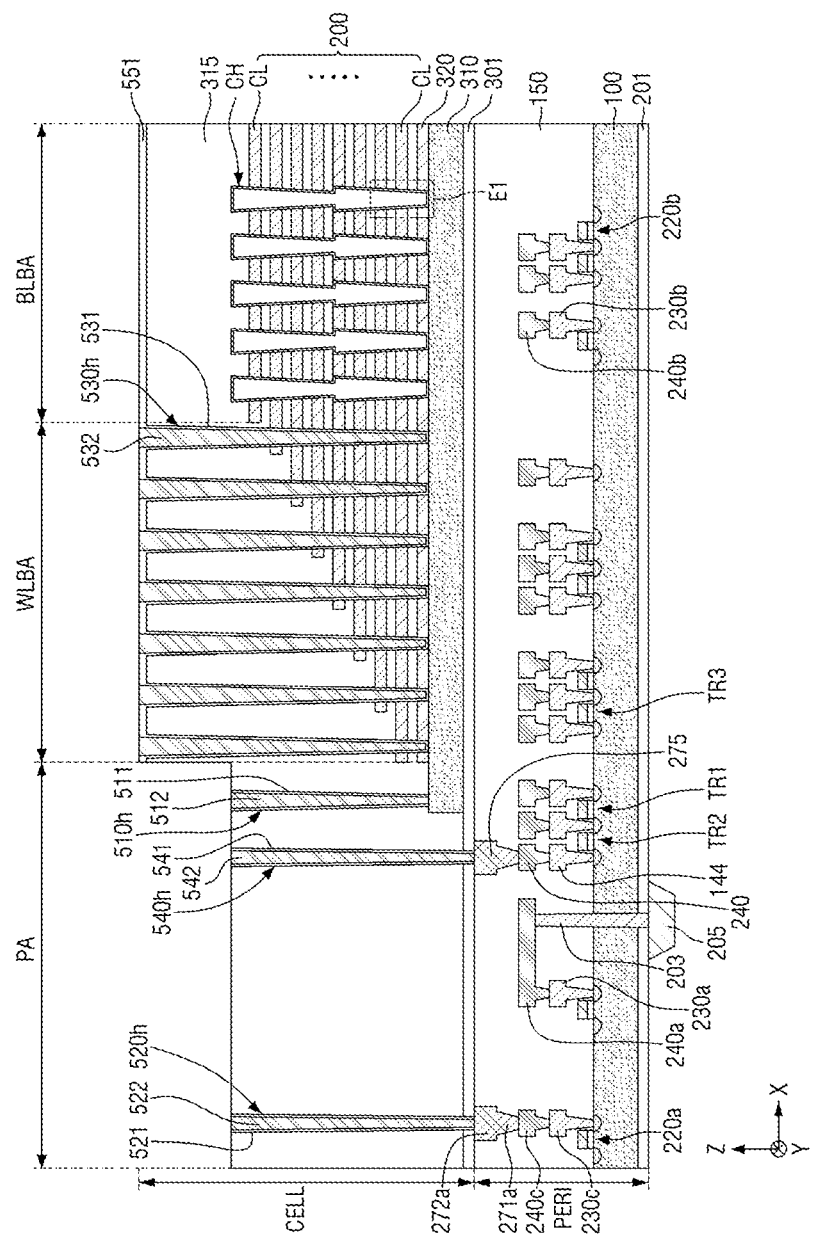

Referring to FIG. 13, the first conductive core pattern 512, the second conductive core patterns 522, a dummy conductive core patterns 532, and a third conductive core patterns 542 that fill the insides of each of the plate contact hole 510h, the second I/O contact hole 520h, the dummy hole 530h, and the connecting contact hole 540h, respectively, may be formed to finalize the plate contact plug 510, the second I/O contact plug 520, the dummy conductive structure 530, and the connecting contact plug 540, respectively.

The first conductive core pattern 512, the second conductive core pattern 522, the dummy conductive core pattern 532, and the third conductive core pattern 542 may be formed at the same time by the same process. The first conductive core pattern 512, the second conductive core pattern 522, the dummy conductive core pattern 532, and the third conductive core pattern 542 may include a conductive material, e.g., tungsten.

Figure 14:
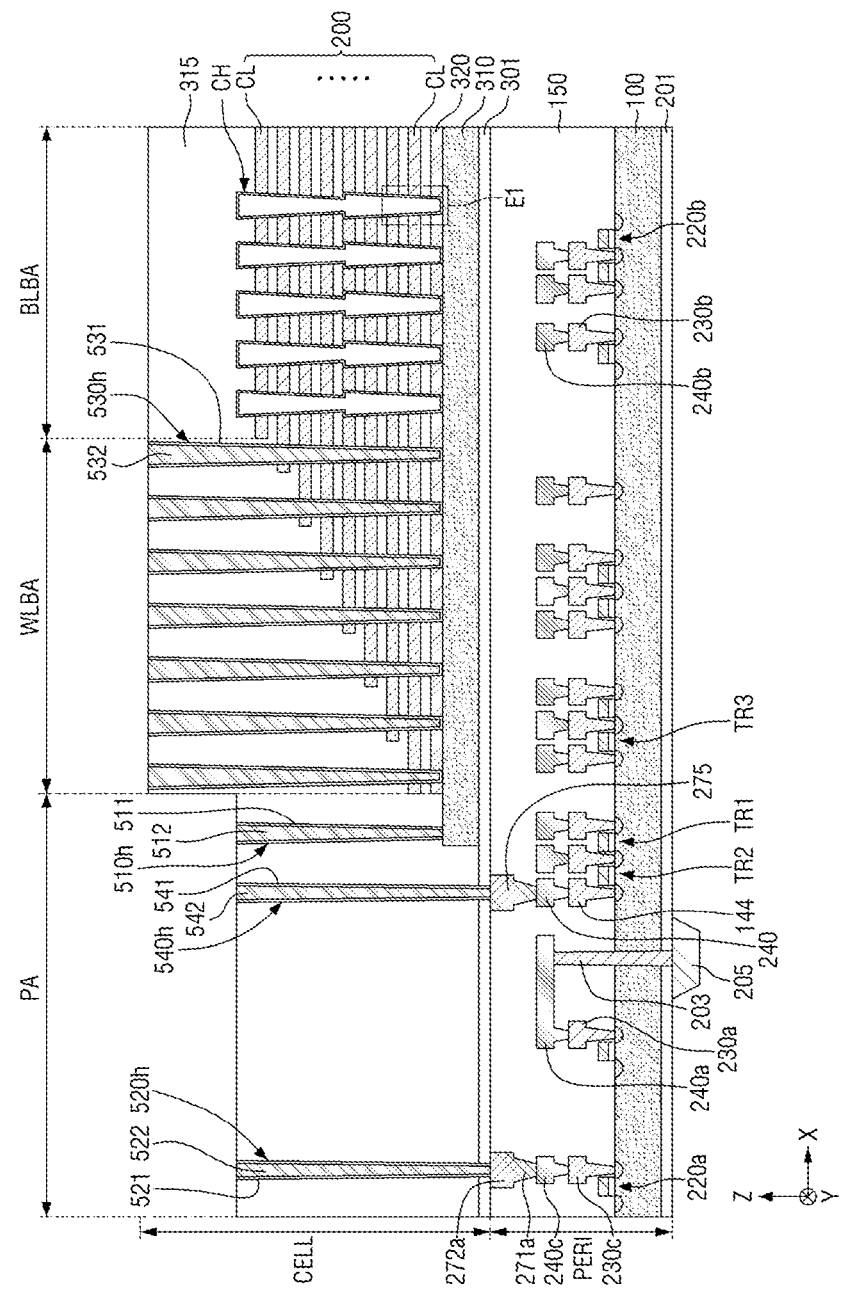

Referring to FIG. 14, the spacer connection film 551 may be removed. For example, a flattening process may be performed. The flattening process may include, e.g., a chemical mechanical polishing (CMP) process. For example, as illustrated in FIG. 14, the channel structure may be formed as a multi-stack.

Figure 15:
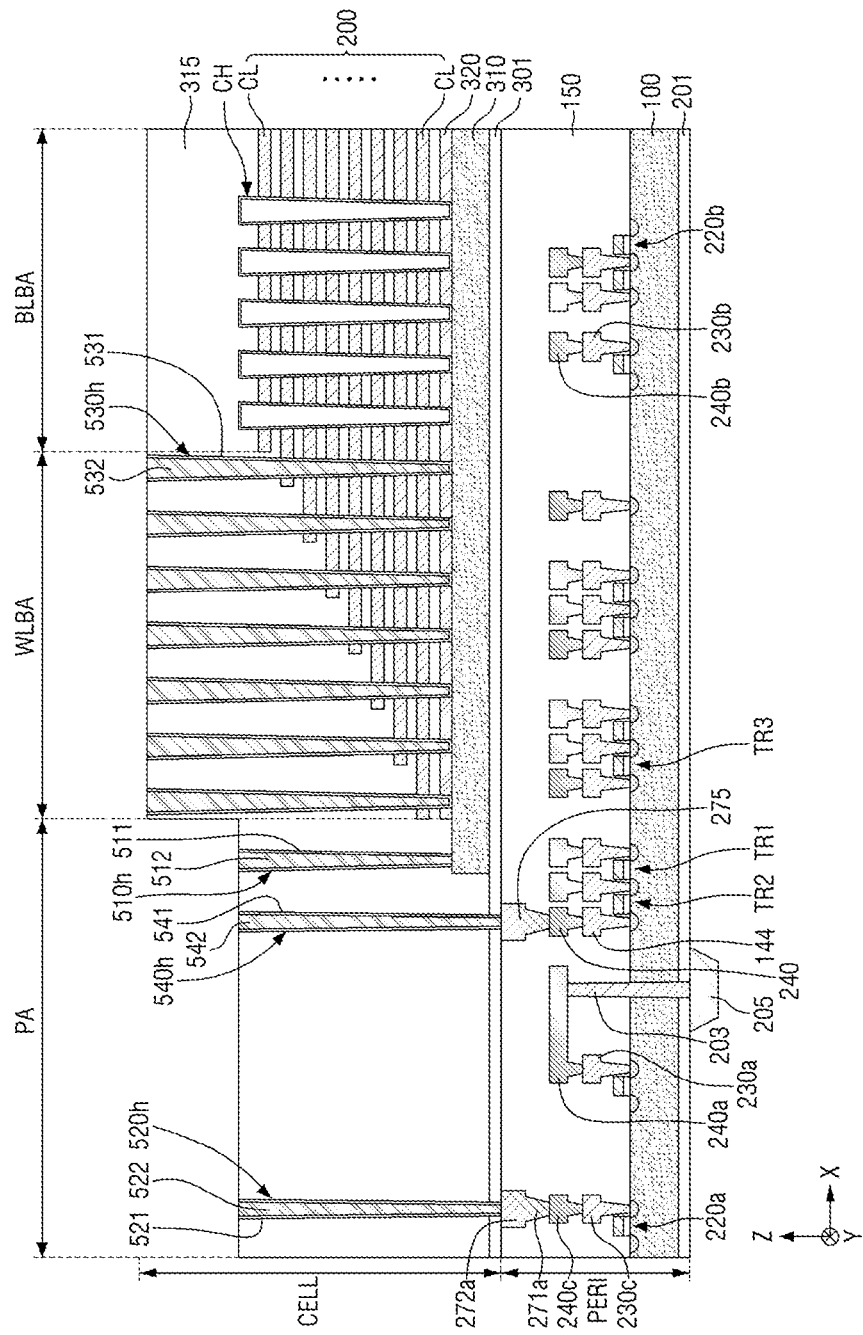

In another example, as illustrated in FIG. 15, the channel structure CH of the semiconductor memory device according to some embodiments may be formed as a single stack. For reference, FIG. 15 is an example intermediate stage diagram showing the same stage as in FIG. 14.

Referring back to FIGS. 2 and 3, metal layers may be connected, e.g., to the second I/O contact plug 520. Next, the second interlayer insulating film 315 may be formed to cover, e.g., entire, tops of the dummy conductive structures 530.

Figure 16:
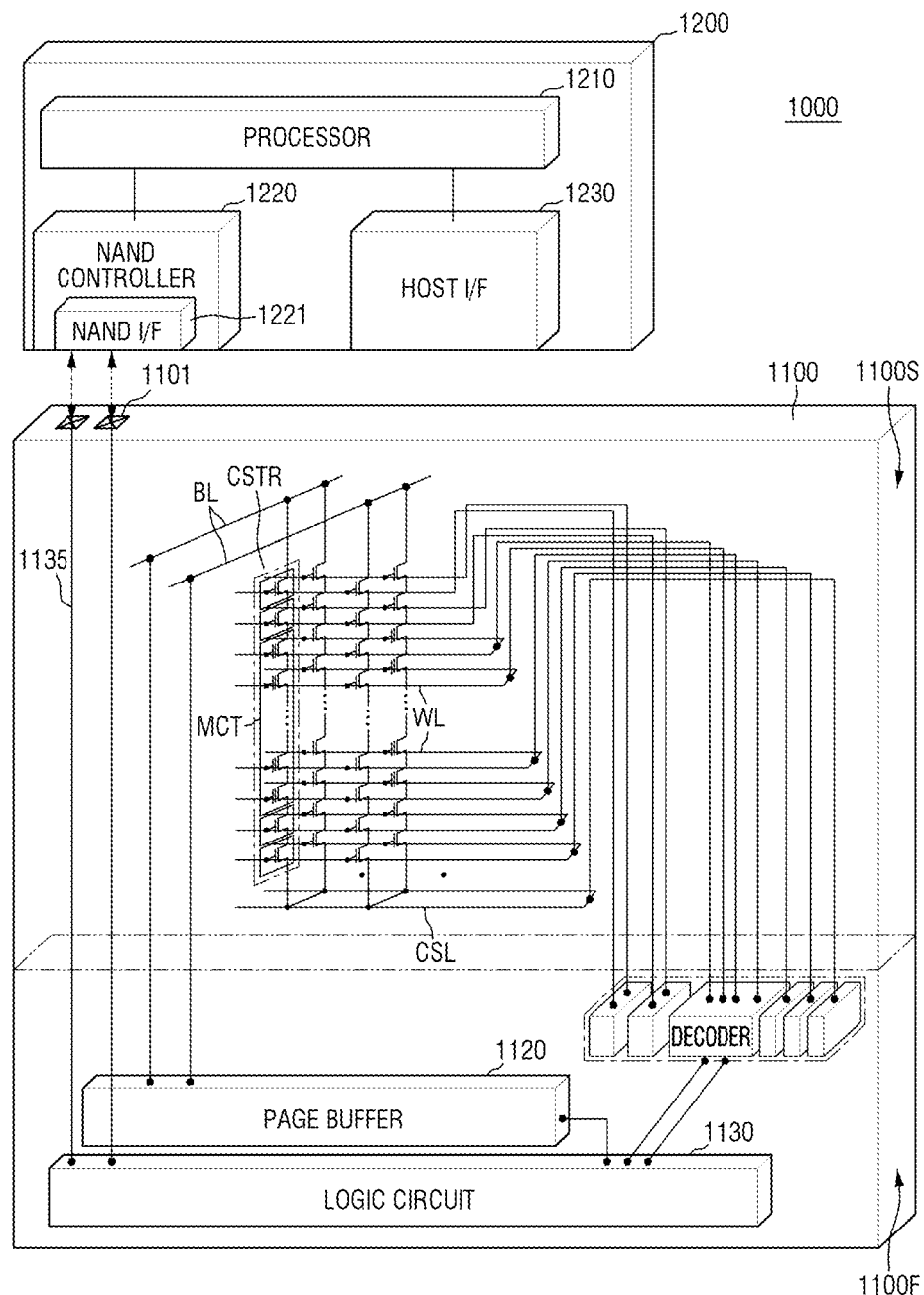
FIG. 16 is a schematic block diagram of an electronic system according to some embodiments.
Figure 17:
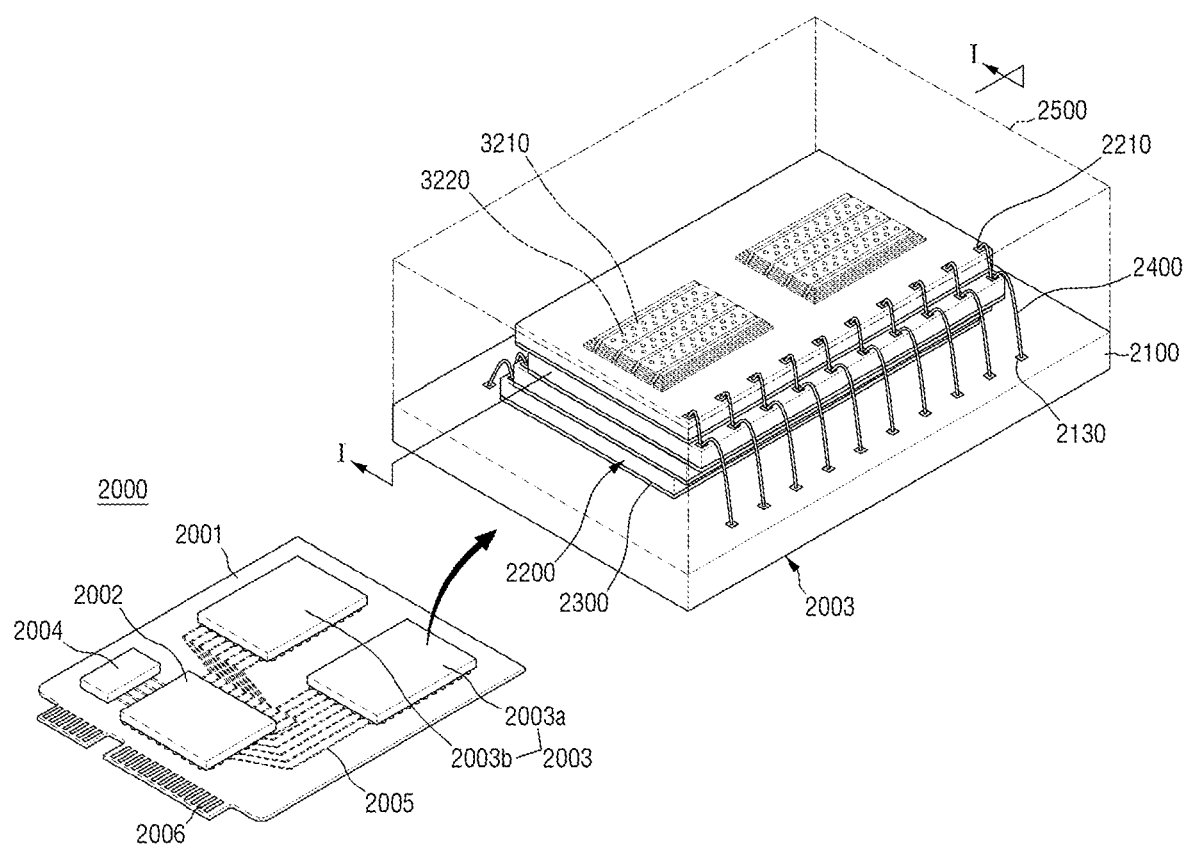
FIG. 17 is a schematic perspective view of an electronic system according to some embodiments.
Figure 18:
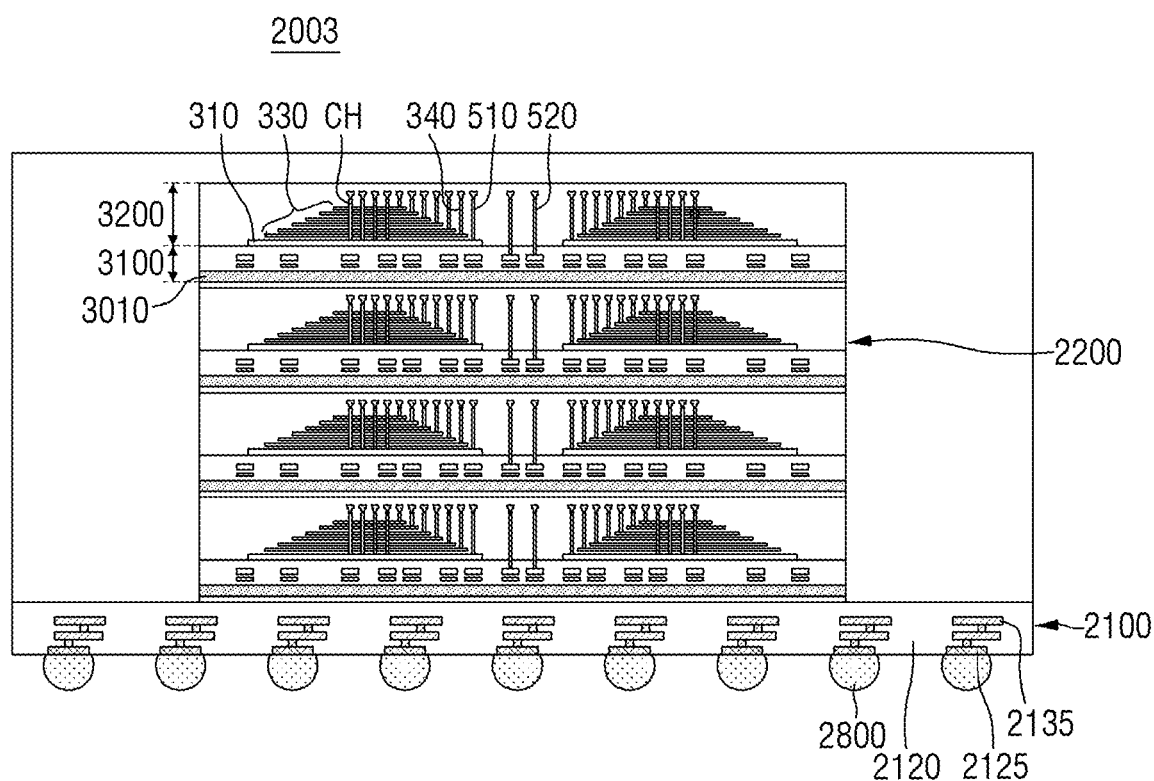
FIGS. 18 and 19 are schematic cross-sectional views along line I-I of FIG. 17.
Figure 19:
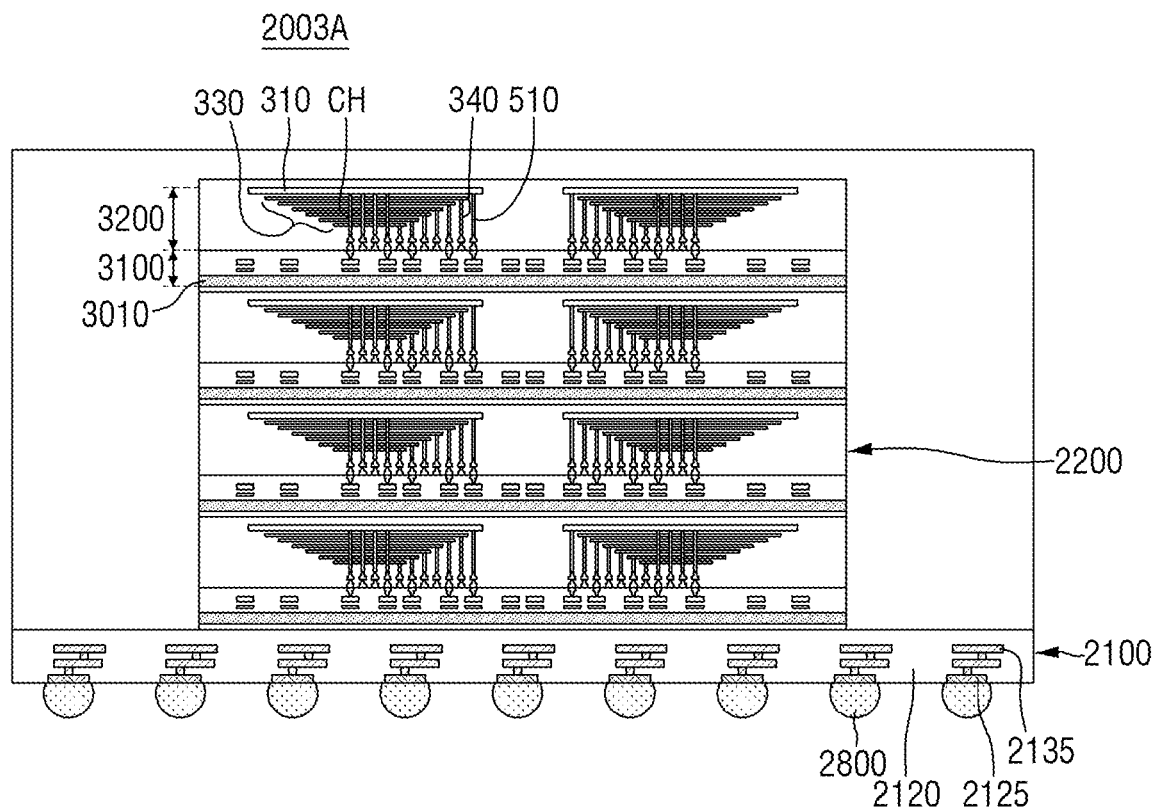

FIG. 16 is a schematic block diagram of an electronic system according to some embodiments. FIG. 17 is a schematic perspective view of an electronic system according to some embodiments. FIGS. 18 and 19 are various schematic cross-sectional views along line I-I of FIG. 17. For convenience of explanation, repeated explanation of contents explained above using FIGS. 1 to 15 will be only briefly explained or omitted.

Referring to FIG. 16, an electronic system 1000 according to some embodiments may include a semiconductor memory device 1100, and a controller 1200 that is electrically connected to the semiconductor memory device 1100. The electronic system 1000 may be a storage device that includes a single or plurality of semiconductor memory devices 1100, or an electronic device that includes the storage device. For example, the electronic system 1000 may be a solid state drive (SSD) device including a single or plurality of semiconductor memory devices 1100, a Universal Serial Bus (USB), a computing system, a medical device, or a communication device.

The semiconductor memory device 1100 may be a non-volatile memory device, e.g., a NAND flash memory device, and may be, e.g., the semiconductor memory device described above using to FIGS. 1 to 5. The semiconductor memory device 1100 may communicate with the controller 1200 through an I/O pad 1101 that is electrically connected to a logic circuit 1130. The I/O pad 1101 may be electrically connected to the logic circuit 1130 through an I/O connection wiring 1135 that extends from a first structure 1100F to a second structure 1100S.

The controller 1200 may include a processor 1210, a NAND controller 1220, and a host interface (I/F) 1230. In some embodiments, the electronic system 1000 may include a plurality of semiconductor memory devices 1100, and in this case, the controller 1200 may control the plurality of semiconductor memory devices 1100.

The processor 1210 may control the overall operation of the electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from an external host through the host interface 1230, the processor 1210 may control the semiconductor memory device 1100 in response to the control command.

Referring to FIG. 17, an electronic system 2000 according to some embodiments may include a main board 2001, a main controller 2002 mounted on the main board 2001, one or more semiconductor packages 2003, and a dynamic random-access memory (DRAM) 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and placement of the plurality of pins may vary depending on the communication interface between the electronic system 2000 and the external host. In some embodiments, the electronic system 2000 may communicate with an external host according to any one of interfaces such as M-Phy for a USB, a PCI-Express (Peripheral Component Interconnect Express), a SATA (Serial Advanced Technology Attachment), and a UFS (Universal Flash Storage). In some embodiments, the electronic system 2000 may be operated by power supplied from an external host through the connector 2006. The electronic system 2000 may further include a PMIC (Power Management Integrated Circuit) that distributes the power, which is supplied from the external host, into the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for alleviating a speed difference between the semiconductor package 2003, which is a data storage space, and an external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003a and a second semiconductor package 2003b that are spaced apart from each other. The first and second semiconductor packages 2003a and 2003b may each be a semiconductor package that includes a plurality of semiconductor chips 2200. The first and second semiconductor packages 2003a and 2003b may each include a package substrate 2100, the semiconductor chips 2200 on the package substrate 2100, adhesive layers 2300 placed on the lower surfaces of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 16. Each of the semiconductor chips 2200 may include memory blocks 3210 and channel structures 3220. The memory blocks 3210 may correspond to the memory block of FIG. 2, and the channel structures 3220 may correspond to the channel structure CH of FIG. 2. Each of the semiconductor chips 2200 may include the semiconductor memory device explained above using FIGS. 1 to 5.

In some embodiments, the connecting structure 2400 may be a bonding wire that electrically connects the I/O pad 2210 and the package upper pads 2130. Therefore, in each of the first and second semiconductor packages 2003a and 2003b, the semiconductor chips 2200 may be electrically connected to each other by a bonding wire type, and may be electrically connected to the upper pads 2130 of the package substrate 2100. In some embodiments, in each of first and second semiconductor packages 2003a and 2003b, the semiconductor chips 2200 may also be electrically connected to each other by a connecting structure including a through silicon via (TSV), instead of the bonding wire type connecting structure 2400.

In some embodiments, the main controller 2002 and the semiconductor chips 2200 may also be included in a single package. In some embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

Referring to FIG. 18, in the semiconductor package 2003, the package substrate 2100 may be a printed circuit board. The package substrate 2100 may include a package substrate body portion 2120, package upper pads (2130 of FIG. 17) placed on an upper surface of the package substrate body portion 2120, lower pads 2125 placed on a lower surface of the package substrate body portion 2120 or exposed through the lower surface, and inner wirings 2135 that electrically connect the upper pads 2130 and the lower pads 2125 inside the package substrate body portion 2120. The upper pads 2130 may be electrically connected to the connecting structures 2400. The lower pads 2125 may be connected to the wiring patterns 2005 of the main board 2010 of the electronic system 2000 through the conductive connections 2800, as in FIGS. 17 and 18.

Each of the semiconductor chips 2200 may include a semiconductor substrate 3010, and a first structure 3100 and a second structure 3200 that are sequentially stacked on the semiconductor substrate 3010. The semiconductor substrate 3010 may correspond to the first substrate 100 of FIG. 2. The first structure 3100 may correspond to the peripheral circuit region PERI of FIG. 2, and the second structure 3200 may correspond to the cell region CELL of FIG. 2.

For example, the second structure 3200 may include the second substrate 310, the plurality of word lines, the channel structure CH, and the plurality of cell contact plugs 340, e.g., which are also illustrated in FIG. 2. Each of the semiconductor chips 2200 may further include an I/O pad (2210 of FIG. 17) that is electrically connected to the first structure 3100.

Referring to FIG. 19, in the semiconductor package 2003A, each of the semiconductor chips 2200 may include the first structure 3100 and the second structure 3200 bonded by a wafer bonding type. For example, the first structure 3100 may correspond to the peripheral circuit region PERI of FIG. 2, and the second structure 3200 may correspond to the cell region CELL of FIG. 2.

The semiconductor chips 2200 of FIGS. 18 and 19 may be electrically connected to each other by the bonding wire type connecting structures (2400 of FIG. 17). However, in some embodiments, the semiconductor chips in the single semiconductor package, such as the semiconductor chips 2200 of FIGS. 18 and 19, may be electrically connected to each other by a connecting structure including a through silicon via (TSV).

By way of summation and review, aspects of the present disclosure provide a semiconductor memory device having a simplified fabricating process. Aspects of the present disclosure also provide an electronic system that has the simplified fabricating process. That is, according to embodiments, a semiconductor device includes dummy conductive structures through the stacked word lines, such that a height of upper surfaces of the dummy conductive structures is higher than an upper surface of the plate contact plug relative to an upper surface of the substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a first substrate including a first region and a second region;
a stacked structure only on the first region of the first substrate among the first region and the second region of the first substrate, the stacked structure including word lines;
an interlayer insulating film covering the stacked structure;
a dummy conductive structure inside the interlayer insulating film, the dummy conductive structure extending through the stacked structure to contact the first substrate; and
a plate contact plug inside the interlayer insulating film, the plate contact plug being connected to the second region of the first substrate, and a height of an upper surface of the dummy conductive structure being greater than a height of an upper surface of the plate contact plug relative to an upper surface of the first substrate.

2. The semiconductor memory device as claimed in claim 1, wherein the dummy conductive structure includes a dummy conductive core pattern, and a dummy spacer extending along a side surface of the dummy conductive core pattern.

3. The semiconductor memory device as claimed in claim 2, wherein the dummy spacer includes an insulating material.

4. The semiconductor memory device as claimed in claim 1, wherein the plate contact plug includes a first conductive core pattern, and a first spacer extending along a side surface of the first conductive core pattern.

5. The semiconductor memory device as claimed in claim 4, wherein:

the dummy conductive structure includes a dummy conductive core pattern, and a dummy spacer extending along a side surface of the dummy conductive core pattern, and
the first spacer and the dummy spacer include a same insulating material.

6. The semiconductor memory device as claimed in claim 4, wherein the first conductive core pattern is connected to the first substrate.

7. The semiconductor memory device as claimed in claim 1, further comprising:
a second substrate;
a peripheral circuit on the second substrate;
a metal layer connected to the peripheral circuit; and
a connecting contact plug inside the interlayer insulating film and connected to the metal layer.

8. The semiconductor memory device as claimed in claim 7, wherein the peripheral circuit and the metal layer are between the first substrate and the second substrate.

9. The semiconductor memory device as claimed in claim 7, wherein the connecting contact plug includes a first conductive core pattern connected to the metal layer, and a first spacer extending along a side surface of the first conductive core pattern.

10. The semiconductor memory device as claimed in claim 9, wherein:
the plate contact plug includes a second conductive core pattern, and a second spacer which extends along a side surface of the second conductive core pattern,
the dummy conductive structure includes a dummy conductive core pattern, and a dummy spacer which extends along a side surface of the dummy conductive core pattern, and
the first spacer, the second spacer, and the dummy spacer include a same insulating material.

11. A semiconductor memory device, comprising:
a first substrate including a first region and a second region;
a stacked structure only on the first region of the first substrate among the first region and the second region of the first substrate, the stacked structure including word lines;
an interlayer insulating film covering the stacked structure;
a dummy conductive structure inside the interlayer insulating film, the dummy conductive structure extending through the stacked structure to contact the first substrate; and
a plate contact plug inside the interlayer insulating film and connected to the second region of the first substrate, the plate contact plug including a first conductive core pattern and a first spacer extending along a side surface of the first conductive core pattern, and a height of an upper surface of the dummy conductive structure being different from a height of an upper surface of the plate contact plug relative to an upper surface of the first substrate.

12. The semiconductor memory device as claimed in claim 11, wherein the dummy conductive structure includes a dummy conductive core pattern, and a dummy spacer extending along a side surface of the dummy conductive core pattern.

13. The semiconductor memory device as claimed in claim 12, wherein the first spacer and the dummy spacer include a same insulating material.

14. The semiconductor memory device as claimed in claim 11, further comprising:
a second substrate;
a peripheral circuit on the second substrate;
a metal layer connected to the peripheral circuit; and
a connecting contact plug inside the interlayer insulating film and connected to the metal layer.

15. The semiconductor memory device as claimed in claim 14, wherein the peripheral circuit and the metal layer are between the first substrate and the second substrate.

16. The semiconductor memory device as claimed in claim 14, wherein the stacked structure is between the first substrate and the second substrate.

17. The semiconductor memory device as claimed in claim 14, wherein the connecting contact plug includes a second conductive core pattern, and a second spacer extending along a side surface of the second conductive core pattern.

18. The semiconductor memory device as claimed in claim 17, wherein:
the dummy conductive structure includes a dummy conductive core pattern, and a dummy spacer extending along a side surface of the dummy conductive core pattern, and
the first spacer, the second spacer, and the dummy spacer include a same insulating material.

19. An electronic system, comprising:
a main board;
a semiconductor memory device on the main board; and
a controller on the main board and electrically connected to the semiconductor memory device,
wherein the semiconductor memory device includes:
a first substrate including a first region and a second region,
a stacked structure only on the first region of the first substrate among the first region and the second region of the first substrate, the stacked structure including word lines,
an interlayer insulating film covering the stacked structure,
a dummy conductive structure inside the interlayer insulating film, the dummy conductive structure extending through the stacked structure to contact the first substrate, and
a plate contact plug inside the interlayer insulating film, the plate contact plug being connected to the second region of the first substrate, and a height of an upper surface of the dummy conductive structure being greater than a height of an upper surface of the plate contact plug relative to an upper surface of the first substrate.

20. The electronic system as claimed in claim 19, wherein:
the semiconductor memory device further includes:
a second substrate, a peripheral circuit on the second substrate, and a metal layer connected to the peripheral circuit, and
a connecting contact plug placed inside the interlayer insulating film and connected to the metal layer,
the plate contact plug includes a first conductive core pattern, and a first spacer extending along a side surface of the first conductive core pattern,
the first conductive core pattern is connected to the first substrate,
the connecting contact plug includes a second conductive core pattern, and a second spacer extending along a side surface of the second conductive core pattern, and the second conductive core pattern is connected to the metal layer on the second substrate.

\* \* \* \* \*